US012725096B2

(12) United States Patent
Lee

(10) Patent No.: US 12,725,096 B2
(45) Date of Patent: Sep. 1, 2026

(54) SYSTEMS AND METHODS FOR BALANCING SPACE UTILIZATION IN A BUILDING

(71) Applicant: Tyco Fire & Security GmbH, Schaffhausen (CH)

(72) Inventor: Young M. Lee, Old Westbury, NY (US)

(73) Assignee: TYCO FIRE & SECURITY GMBH, Neuhausen am Rheinfall (CH)

( * ) Notice: Subject to any disclaimer, the term of this patent is extended or adjusted under 35 U.S.C. 154(b) by 1133 days.

(21) Appl. No.: 17/539,757

(22) Filed: Dec. 1, 2021

(65) Prior Publication Data

US 2023/0169221 A1 Jun. 1, 2023

(51) Int. Cl.

*G06Q 10/02* (2012.01)
*G06F 16/906* (2019.01)
*G06F 30/13* (2020.01)
*H05B 47/115* (2020.01)
*G05D 23/19* (2006.01)

(52) U.S. Cl.

CPC ........... *G06Q 10/02* (2013.01); *G06F 16/906* (2019.01); *G06F 30/13* (2020.01); *H05B 47/115* (2020.01); *G05B 2219/2614* (2013.01); *G05D 23/19* (2013.01)

(58) Field of Classification Search

CPC ........ G06F 30/13; G06F 16/906; G06F 30/20; G06Q 10/02; H05B 47/115
See application file for complete search history.

(56) References Cited

U.S. PATENT DOCUMENTS 9,955,318 B1 * 4/2018 Scheper ................ H04W 4/024
2015/0168963 A1 * 6/2015 Wood ................ G05D 23/1934 700/275
2019/0361407 A1 * 11/2019 Vogel ..................... G01R 22/10
2020/0355391 A1 * 11/2020 Wenzel .................... F24F 11/58
2021/0010701 A1 * 1/2021 Nesler ....................... F24F 3/14
2021/0011443 A1 * 1/2021 Mcnamara ............... F24F 11/61
2024/0420034 A1 * 12/2024 Hiramatsu ............ G06Q 50/06

* cited by examiner

*Primary Examiner* — Rehana Perveen
*Assistant Examiner* — John P Hocker
(74) *Attorney, Agent, or Firm* — Foley & Lardner LLP

(57) ABSTRACT

A method for balancing space utilization in a building. The method includes identifying a first space and a second space of a building; determining, for a plurality of individuals assigned to the first space, (i) first differences between first preferences of the plurality of individuals for a first characteristic of the second space and a first value of the first characteristic, and (ii) second differences between second preferences of the plurality of individuals for a second characteristic of the second space and a second value of the second characteristic; determining a subset of individuals to move from the first space to the second space based on a combination of the first differences and the second differences; and implementing a reassignment of the subset of individuals to the second space or generating, by the one or more processors, a recommendation to reassign the subset of individuals to the second space.

18 Claims, 11 Drawing Sheets

300
302
304
Return Air
306
Building Zone
308
310
Supply Air
312
314
Outside Air
316
318
320
322
Exhaust Air
324
326
328
330
AHU Controller
332
334
336
338
340
342
344
346
348
350
352
354
356
358
360
362
364
366
BMS Controller
368
370
372

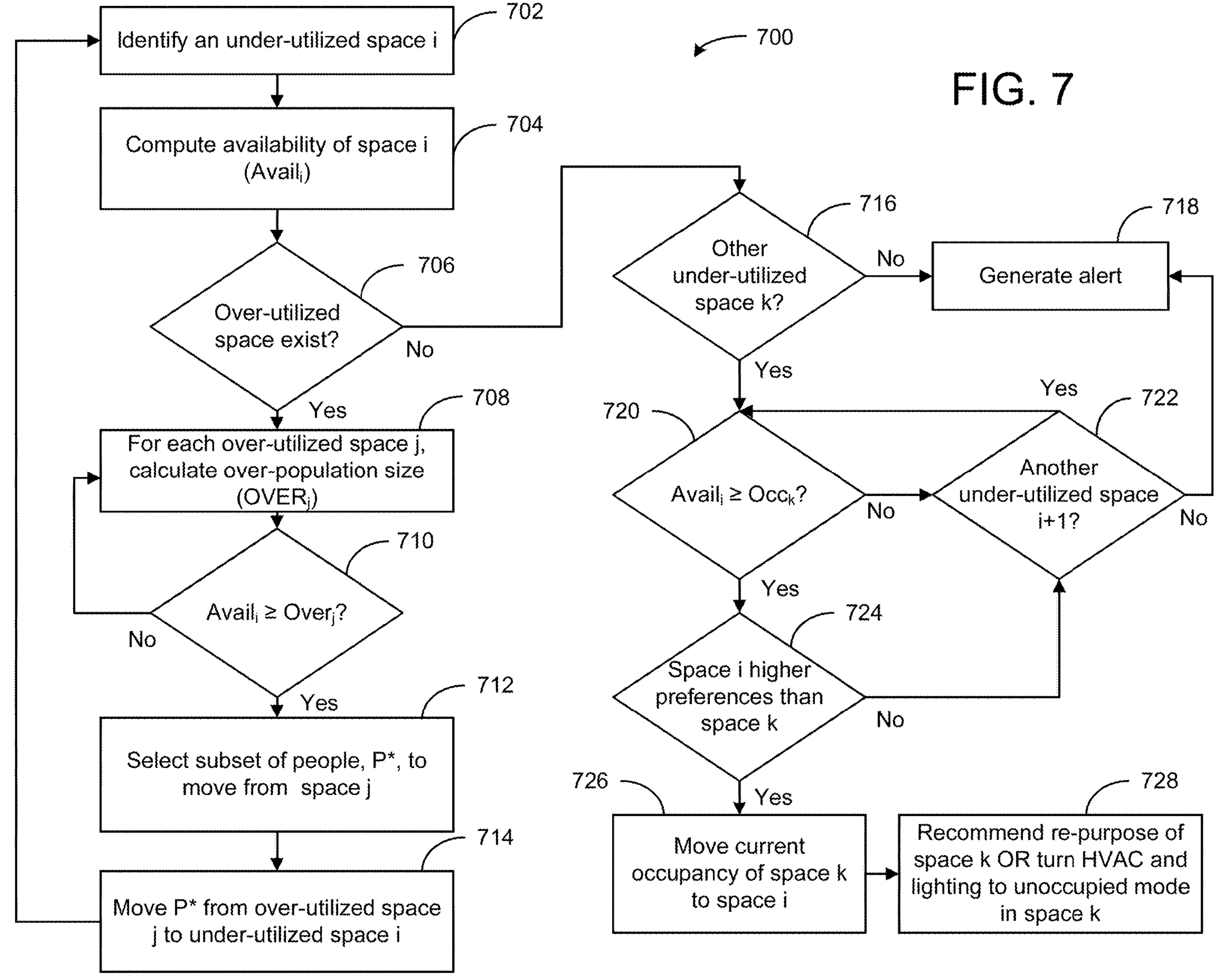
700
FIG. 7
Identify an under-utilized space i
702
Compute availability of space i (Avail_i)
704
Over-utilized space exist?
706
No
Yes
For each over-utilized space j, calculate over-population size (OVER_j)
708
Avail_i ≥ Over_j?
710
No
Yes
Select subset of people, P*, to move from space j
712
Move P* from over-utilized space j to under-utilized space i
714
Other under-utilized space k?
716
No
Yes
Generate alert
718
Avail_i ≥ Occ_k?
720
No
Yes
Another under-utilized space i+1?
722
Yes
No
Space i higher preferences than space k
724
No
Yes
Move current occupancy of space k to space i
726
Recommend re-purpose of space k OR turn HVAC and lighting to unoccupied mode in space k
728

SYSTEMS AND METHODS FOR BALANCING SPACE UTILIZATION IN A BUILDING

BACKGROUND

The present disclosure relates generally to building management systems (BMS), and more particularly to balancing space utilization in a building.

It is common for companies to have open workspaces where multiple offices, cubicles, and desks are available for employees to occupy. These open spaces can have different utilization levels (i.e., over-utilized, under-utilized, reasonably utilized). For example, a space with a maximum occupancy of 25 people may have an under-utilization threshold of 10 people (e.g., the space is underutilized if less than 10 people are assigned to the space) and an over-utilization threshold of 20 people (e.g., the space is over-utilized if more than 20 people are assigned to the space). If the number of people assigned to the space is between these two thresholds, the space may be considered to be "reasonably utilized."

Over-utilized and under-utilized spaces may each cause problems that impact how the building and/or the employees operate. For example, over-utilized spaces may incur reduced productivity as employees become too close to each other and obstruct each other's paths and/or talk to each other. Over-utilized spaces may also incur other problems such as increasing the chances of spreading infectious diseases between the employees that are near each other. Such health risks have become more pronounced with the onset of infectious diseases such as COVID-19.

In another example, under-utilized and over-utilized spaces may incur high facility costs such as electricity costs for heating, cooling, and lighting; cleaning; security; etc., within a building. For instance, there may be multiple spaces in a building that are under-utilized, and the heating, ventilation, or air conditioning (HVAC) equipment may operate to keep the spaces at a comfortable temperature. In these instances, employees may be spread between too many spaces and the HVAC equipment may use excess energy to ensure each employee is comfortable in the spaces. In another case, an over-utilized space may cause the HVAC equipment operating to maintain a set temperature in the space to use more energy to account for the excess body heat of the room's occupants.

SUMMARY

A method for balancing space utilization between an overutilized first space and an underutilized second space in a building includes: identifying, by one or more processors, the first space and the second space of a building, the first space having a first utilization rate that exceeds a second utilization rate of the second space; determining, by the one or more processors for a plurality of individuals assigned to the first space, (i) first differences between first preferences of the plurality of individuals for a first characteristic of the second space and a first value of the first characteristic, and (ii) second differences between second preferences of the plurality of individuals for a second characteristic of the second space and a second value of the second characteristic; determining, by the one or more processors, a subset of individuals of the plurality of individuals to move from the first space to the second space based on a combination of the first differences and the second differences; and implementing, by the one or more processors, a reassignment of the subset of individuals to the second space or generating, by the one or more processors, a recommendation to reassign the subset of individuals to the second space responsive to determining the subset of individuals to move from the first space to the second space.

In some embodiments, the method includes adjusting, by the one or more processors, configurations of building equipment that operate to affect one or more points of the first space or the second space based on the determined subset of individuals.

In some embodiments, implementing the reassignment of the subset of individuals to the second space comprises updating, by the one or more processors, a data structure stored in memory to indicate the subset of individuals are assigned to the second space.

In some embodiments, determining the subset of individuals to move from the first space to the second space comprises determining, by the one or more processors, the subset of individuals responsive to determining the subset of individuals satisfies an objective function.

In some embodiments, determining the subset of individuals satisfies the objective function comprises: iteratively determining, by the one or more processors, a plurality of prediction scores for the plurality of individuals assigned to the first space according to preferences of the plurality of individuals; and identifying, by the one or more processors, the subset of individuals of the plurality of individuals responsive to the subset having prediction scores that satisfy the objective function.

In some embodiments, the method includes assigning, by the one or more processors, a first weight to the first differences and a second weight to the second differences; wherein determining the subset of individuals to move from the first space to the second space comprises aggregating, by the one or more processors, the first differences according to the first weight and the second differences according to the second weight, wherein, determining the subset of individuals to move from the first space to the second space comprises aggregating, by the one or more processors, the first differences according to the first weight and the second differences according to the second weight.

In some embodiments, the method includes receiving, by the one or more processors, a plurality of space ratings for the second space from the plurality of individuals; determining, by the one or more processors, third differences between the plurality of space ratings and a space rating value; wherein determining the subset of individuals to move from the first space to the second space further comprises aggregating, by the one or more processors, the third differences with the first differences and the second differences, wherein determining the subset of individuals to move from the first space to the second space further comprises aggregating, by the one or more processors, the third differences with the first differences and the second differences.

In some embodiments, identifying the first space and the second space of the building comprises: generating, by the one or more processors, (i) a first list of spaces with first space utilization rates above first thresholds that correspond to the respective spaces of the first list, and (ii) a second list of spaces with second space utilization rates below second thresholds that correspond to the respective spaces of the second list; and identifying, by the one of more processors, (i) the first space from the first list based on a first difference between the first space utilization rate of the first space and a first threshold of the first space, and (ii) the second space from the second list based on a second difference between the second utilization rate of the second space and a second threshold of the second space.

In some embodiments, identifying the second space from the second list comprises: comparing, by the one or more processors, the second difference with the first difference; and identifying, by the one or more processors, the second space responsive to the second difference exceeding the first difference.

In some embodiments, implementing the reassignment of the subset of individuals to the second space comprises updating, by the one or more processors, a data structure stored in memory to indicate the first plurality of individuals are assigned to the second space.

In some embodiments, the method includes determining, by the one or more processors, the availability of the second space by comparing a utilization rate of the second space with a capacity of the second space, wherein implementing the reassignment of the first plurality of individuals or generating the recommendation to reassign the first plurality of individuals is performed further responsive to determining, by the one or more processors, the first plurality of individuals does not exceed an availability of the second space.

A system for balancing space utilization in a building includes one or more memory devices configured to store instructions thereon that, when executed by one or more processors, cause the one or more processors to: identify a first space and a second space of a building; determine, for a plurality of individuals assigned to the first space, (i) first differences between first preferences of the plurality of individuals for a first characteristic of the second space and a first value of the first characteristic, and (ii) second differences between second preferences of the plurality of individuals for a second characteristic of the second space and a second value of the second characteristic; determine a subset of individuals of the plurality of individuals to move from the first space to the second space based on a combination of the first differences and the second differences; and implement a reassignment of the subset of individuals to the second space or generating, by the one or more processors, a recommendation to reassign the individuals to the second space responsive to determining the subset of individuals to move from the first space to the second space.

In some embodiments, the instructions cause the one or more processors to: adjust configurations of building equipment that operate to affect one or more points of the first space or the second space based on the determined subset of individuals.

In some embodiments, the instructions cause the one or more processors to implement the reassignment of the subset of individuals to the second space by updating a data structure stored in memory to indicate the subset of individuals are assigned to the second space.

In some embodiments, the instructions cause the one or more processors to determine the subset of individuals to move from the first space to the second space by determining the subset of individuals responsive to determining the subset of individuals satisfies an objective function.

In some embodiments, the instructions cause the one or more processors to determine the subset of individuals satisfies the objective function by: iteratively determining a plurality of prediction scores for the plurality of individuals assigned to the first space according to preferences of the plurality of individuals; and identifying the subset of individuals of the plurality of individuals responsive to the subset having prediction scores that satisfy the objective function.

In some embodiments, the instructions further cause the one or more processors to: assigning a first weight to the first differences and a second weight to the second differences; wherein the instructions cause the one or more processors to determine the subset of individuals to move from the first space to the second space by aggregating the first differences according to the first weight and the second differences according to the second weight.

A method of addressing underutilization of spaces in a building includes: identifying, by one or more processors, a first space of a building; determining, by the one or more processors, (i) for a first plurality of individuals assigned to the first space, a first sum of first preferences of the first plurality of individuals for a second space of the building, and (ii) for a second plurality of individuals assigned to the second space, a second sum of second preferences of the second plurality of individuals for the first space of the building; responsive to determining the first sum exceeds the second sum, implementing, by the one or more processors, a reassignment of the first plurality of individuals to the second space or generating, by the one or more processors, a recommendation to reassign the first plurality of individuals to the second space, performing, by the one or more processors, an automated action responsive to the first space being unoccupied after the first plurality of individuals are moved to the second space.

In some embodiments, performing the automated action comprises modifying, by the one or more processors, parameters of building equipment to reduce energy usage in the unoccupied first space.

In some embodiments, modifying parameters of the building equipment comprises adjusting, by the one or more processors, configurations of heating, ventilation, or air conditioning equipment or light equipment to an unoccupied mode.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

FIG. 7 is a flow diagram of a process for balancing spaces in a building, according to some embodiments.

DETAILED DESCRIPTION

Overview

Figure 1:
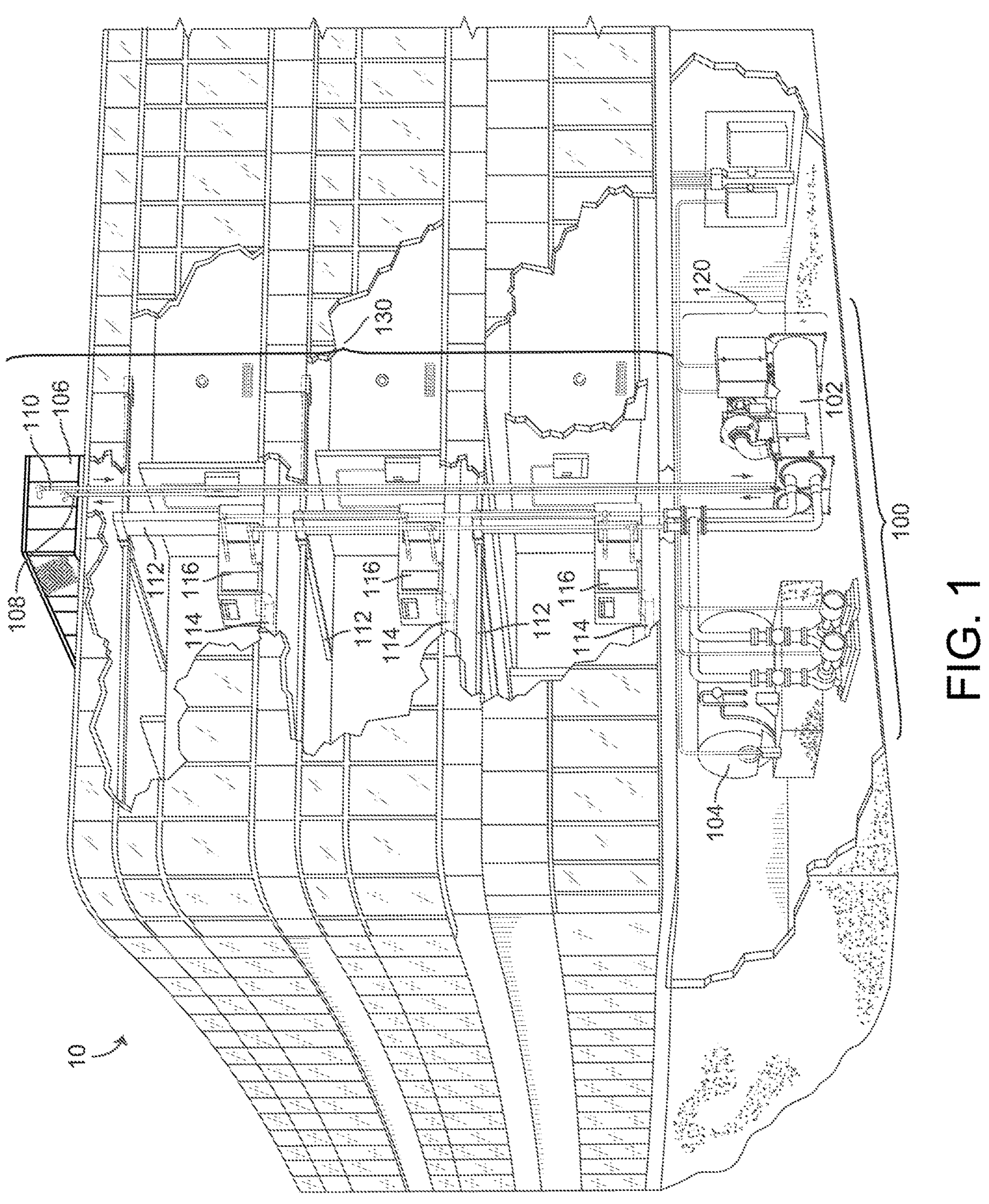
FIG. 1 is a perspective view of a smart building, according to some embodiments.

As previously mentioned, it is common for different spaces of a building (e.g., areas such as rooms or portions of a room of a building) to either have too many or too few occupants. In addition to any productivity issues these conditions may cause in a work environment, these occupancy conditions may also cause building equipment to consume a disproportionate amount of energy while maintaining setpoints within the spaces. For example, in an under-utilized space, building equipment may use a large amount of energy to maintain any defined setpoints for the space and maintain a level of comfortability for each of the space's occupants. Because building equipment often consumes a minimum amount of energy to operate, the energy consumed-per occupant in under-utilized spaces may be relatively high compared to spaces that are in a reasonably utilized state. In another example, in an over-utilized space, building equipment may have to account for excess body heat that exudes from the extra occupants of the space. In doing so, the building equipment may again use a large amount of energy to maintain defined setpoints for the space such as operating fans at higher speeds or using an entire air conditioning unit with more energy to cool the space to account for the excess people. In both cases, the equipment that impacts setpoints in the spaces may operate with a poor energy-per-occupant ratio or energy efficiency.

Implementations of the systems and methods discussed herein provide for a space balancing process that enables a space allocation system to move individuals between different spaces of a building to improve the energy efficiency of the building while accounting for the preferences of the occupants of the building. For example, referring generally to the figures, a space allocation system may evaluate the occupancy of different spaces against different utilization thresholds to determine if the spaces are over-utilized, under-utilized, or reasonably utilized. In some embodiments, if the space allocation system is able to identify an underutilized space (e.g., a space with too few people), the system may determine if there is an over-utilized space (e.g., a space with too many people) from which individuals can be reassigned to the under-utilized space. The system may identify an over-utilized space and then select individuals from the over-utilized space to move to the under-utilized space based on the environment preferences of the selected individuals closely aligning with the environment of the under-utilized space. The space allocation system may reassign the individuals to the under-utilized space so the over-utilized and/or under-utilized space may have an acceptable occupancy.

In some instances, the space allocation system may not be able to identify an over-utilized space. In such instances, the space allocation may instead identify two under-utilized spaces. The space allocation system may determine which of the under-utilized spaces have enough availability to receive the entire occupancy of the other under-utilized space and/or has occupants with a higher preference for the other under-utilized space. The space allocation system may identify the space that meets this criteria and subsequently move the people from the identified space to the other space, thus causing the space to be unoccupied and/or for the other space to potentially be reasonably utilized.

Advantageously, by implementing the systems and methods described herein, the space utilization of a building may be improved. For example, because the space allocation system can move individuals from over-utilized spaces to under-utilized spaces, the equipment that was operating to maintain the comfortability of the over-utilized space may not have to use as much energy to do so with fewer people affecting the environment of the space (e.g., the equipment may no longer have to work as hard to maintain a temperature setpoint to counteract the excess body heat of the over-utilized space). The equipment that operates to maintain the comfortability of the under-utilized space may not have to change its operation after the reassignment because the body temperature of a space that is under-utilized (or now reasonably utilized) may remain relatively constant unless the space reaches the over-utilized state.

In another example, when the space allocation system moves the entire occupancy of an under-utilized space to another under-utilized space, the space allocation system may also improve the energy efficiency of the building. For instance, upon relocating the population from one space to another space, the space allocation system may cause the building equipment that was operating to maintain the comfortability of the now empty space to enter an "unoccupied mode." The unoccupied mode may either be completely off or be a power-saving mode. By entering this mode, the equipment may stop using energy completely or use a negligible amount of energy. The equipment that operates in the space to which the occupants were assigned may use a small amount of added energy to account for the new occupants, but may not use nearly as much energy as was saved by causing the equipment in the now unoccupied space to enter the unoccupied mode. Thus, by implementing the systems and methods described herein, the space allocation system may improve the energy efficiency of a building.

Building and HVAC Systems

Referring particularly to FIG. 1, a perspective view of a building 10 is shown. Building 10 is served by a BMS. A BMS is, in general, a system of devices configured to control, monitor, and manage equipment in or around a building or building area. A BMS can include, for example, a HVAC system, a security system, a lighting system, a fire alerting system, any other system that is capable of managing building functions or devices, or any combination thereof.

The BMS that serves building 10 includes a HVAC system 100. HVAC system 100 can include a plurality of HVAC devices (e.g., heaters, chillers, air handling units, pumps, fans, thermal energy storage, etc.) configured to provide heating, cooling, ventilation, or other services for building 10. For example, HVAC system 100 is shown to include a waterside system 120 and an airside system 130. Waterside system 120 may provide a heated or chilled fluid to an air handling unit of airside system 130. Airside system 130 may use the heated or chilled fluid to heat or cool an airflow provided to building 10. An exemplary waterside system and airside system which can be used in HVAC system 100 are described in greater detail with reference to FIGS. 2-3.

HVAC system 100 is shown to include a chiller 102, a boiler 104, and a rooftop air handling unit (AHU) 106.

Waterside system 120 may use boiler 104 and chiller 102 to heat or cool a working fluid (e.g., water, glycol, etc.) and may circulate the working fluid to AHU 106. In various embodiments, the HVAC devices of waterside system 120 can be located in or around building 10 (as shown in FIG. 1) or at an offsite location such as a central plant (e.g., a chiller plant, a steam plant, a heat plant, etc.). The working fluid can be heated in boiler 104 or cooled in chiller 102, depending on whether heating or cooling is required in building 10. Boiler 104 may add heat to the circulated fluid, for example, by burning a combustible material (e.g., natural gas) or using an electric heating element. Chiller 102 may place the circulated fluid in a heat exchange relationship with another fluid (e.g., a refrigerant) in a heat exchanger (e.g., an evaporator) to absorb heat from the circulated fluid. The working fluid from chiller 102 and/or boiler 104 can be transported to AHU 106 via piping 108.

AHU 106 may place the working fluid in a heat exchange relationship with an airflow passing through AHU 106 (e.g., via one or more stages of cooling coils and/or heating coils). The airflow can be, for example, outside air, return air from within building 10, or a combination of both. AHU 106 may transfer heat between the airflow and the working fluid to provide heating or cooling for the airflow. For example, AHU 106 can include one or more fans or blowers configured to pass the airflow over or through a heat exchanger containing the working fluid. The working fluid may then return to chiller 102 or boiler 104 via piping 110.

Airside system 130 may deliver the airflow supplied by AHU 106 (i.e., the supply airflow) to building 10 via air supply ducts 112 and may provide return air from building 10 to AHU 106 via air return ducts 114. In some embodiments, airside system 130 includes multiple variable air volume (VAV) units 116. For example, airside system 130 is shown to include a separate VAV unit 116 on each floor or zone of building 10. VAV units 116 can include dampers or other flow control elements that can be operated to control an amount of the supply airflow provided to individual zones of building 10. In other embodiments, airside system 130 delivers the supply airflow into one or more zones of building 10 (e.g., via supply ducts 112) without using intermediate VAV units 116 or other flow control elements. AHU 106 can include various sensors (e.g., temperature sensors, pressure sensors, etc.) configured to measure attributes of the supply airflow. AHU 106 may receive input from sensors located within AHU 106 and/or within the building zone and may adjust the flow rate, temperature, or other attributes of the supply airflow through AHU 106 to achieve setpoint conditions for the building zone.

Waterside System

Figure 2:
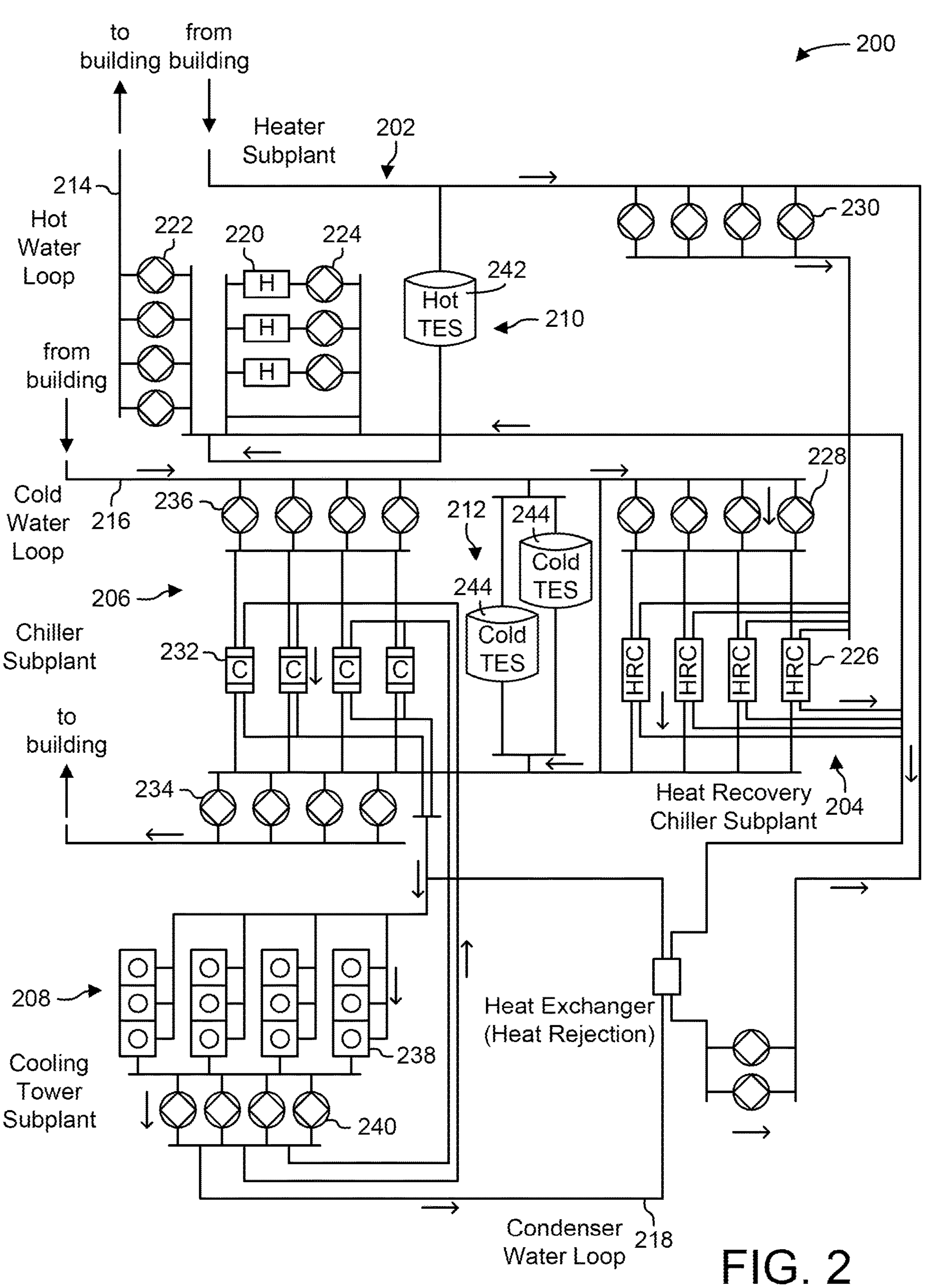
FIG. 2 is a block diagram of a waterside system, according to some embodiments.

Referring now to FIG. 2, a block diagram of a waterside system 200 is shown, according to some embodiments. In various embodiments, waterside system 200 may supplement or replace waterside system 120 in HVAC system 100 or can be implemented separate from HVAC system 100. When implemented in HVAC system 100, waterside system 200 can include a subset of the HVAC devices in HVAC system 100 (e.g., boiler 104, chiller 102, pumps, valves, etc.) and may operate to supply a heated or chilled fluid to AHU 106. The HVAC devices of waterside system 200 can be located within building 10 (e.g., as components of waterside system 120) or at an offsite location such as a central plant.

In FIG. 2, waterside system 200 is shown as a central plant having a plurality of subplants 202-212. Subplants 202-212 are shown to include a heater subplant 202, a heat recovery chiller subplant 204, a chiller subplant 206, a cooling tower subplant 208, a hot thermal energy storage (TES) subplant 210, and a cold thermal energy storage (TES) subplant 212. Subplants 202-212 consume resources (e.g., water, natural gas, electricity, etc.) from utilities to serve thermal energy loads (e.g., hot water, cold water, heating, cooling, etc.) of a building or campus. For example, heater subplant 202 can be configured to heat water in a hot water loop 214 that circulates the hot water between heater subplant 202 and building 10. Chiller subplant 206 can be configured to chill water in a cold water loop 216 that circulates the cold water between chiller subplant 206 building 10. Heat recovery chiller subplant 204 can be configured to transfer heat from cold water loop 216 to hot water loop 214 to provide additional heating for the hot water and additional cooling for the cold water. Condenser water loop 218 may absorb heat from the cold water in chiller subplant 206 and reject the absorbed heat in cooling tower subplant 208 or transfer the absorbed heat to hot water loop 214. Hot TES subplant 210 and cold TES subplant 212 may store hot and cold thermal energy, respectively, for subsequent use.

Hot water loop 214 and cold water loop 216 may deliver the heated and/or chilled water to air handlers located on the rooftop of building 10 (e.g., AHU 106) or to individual floors or zones of building 10 (e.g., VAV units 116). The air handlers push air past heat exchangers (e.g., heating coils or cooling coils) through which the water flows to provide heating or cooling for the air. The heated or cooled air can be delivered to individual zones of building 10 to serve thermal energy loads of building 10. The water then returns to subplants 202-212 to receive further heating or cooling.

Although subplants 202-212 are shown and described as heating and cooling water for circulation to a building, it is understood that any other type of working fluid (e.g., glycol, CO2, etc.) can be used in place of or in addition to water to serve thermal energy loads. In other embodiments, subplants 202-212 may provide heating and/or cooling directly to the building or campus without requiring an intermediate heat transfer fluid. These and other variations to waterside system 200 are within the teachings of the present disclosure.

Each of subplants 202-212 can include a variety of equipment configured to facilitate the functions of the subplant. For example, heater subplant 202 is shown to include a plurality of heating elements 220 (e.g., boilers, electric heaters, etc.) configured to add heat to the hot water in hot water loop 214. Heater subplant 202 is also shown to include several pumps 222 and 224 configured to circulate the hot water in hot water loop 214 and to control the flow rate of the hot water through individual heating elements 220. Chiller subplant 206 is shown to include a plurality of chillers 232 configured to remove heat from the cold water in cold water loop 216. Chiller subplant 206 is also shown to include several pumps 234 and 236 configured to circulate the cold water in cold water loop 216 and to control the flow rate of the cold water through individual chillers 232.

Heat recovery chiller subplant 204 is shown to include a plurality of heat recovery heat exchangers 226 (e.g., refrigeration circuits) configured to transfer heat from cold water loop 216 to hot water loop 214. Heat recovery chiller subplant 204 is also shown to include several pumps 228 and 230 configured to circulate the hot water and/or cold water through heat recovery heat exchangers 226 and to control the flow rate of the water through individual heat recovery heat exchangers 226. Cooling tower subplant 208 is shown to include a plurality of cooling towers 238 configured to remove heat from the condenser water in condenser water loop 218. Cooling tower subplant 208 is also shown to include several pumps 240 configured to circulate the condenser water in condenser water loop 218 and to control the flow rate of the condenser water through individual cooling towers 238.

Hot TES subplant 210 is shown to include a hot TES tank 242 configured to store the hot water for later use. Hot TES subplant 210 may also include one or more pumps or valves configured to control the flow rate of the hot water into or out of hot TES tank 242. Cold TES subplant 212 is shown to include cold TES tanks 244 configured to store the cold water for later use. Cold TES subplant 212 may also include one or more pumps or valves configured to control the flow rate of the cold water into or out of cold TES tanks 244.

In some embodiments, one or more of the pumps in waterside system 200 (e.g., pumps 222, 224, 228, 230, 234, 236, and/or 240) or pipelines in waterside system 200 include an isolation valve associated therewith. Isolation valves can be integrated with the pumps or positioned upstream or downstream of the pumps to control the fluid flows in waterside system 200. In various embodiments, waterside system 200 can include more, fewer, or different types of devices and/or subplants based on the particular configuration of waterside system 200 and the types of loads served by waterside system 200.

Airside System

Figure 3:
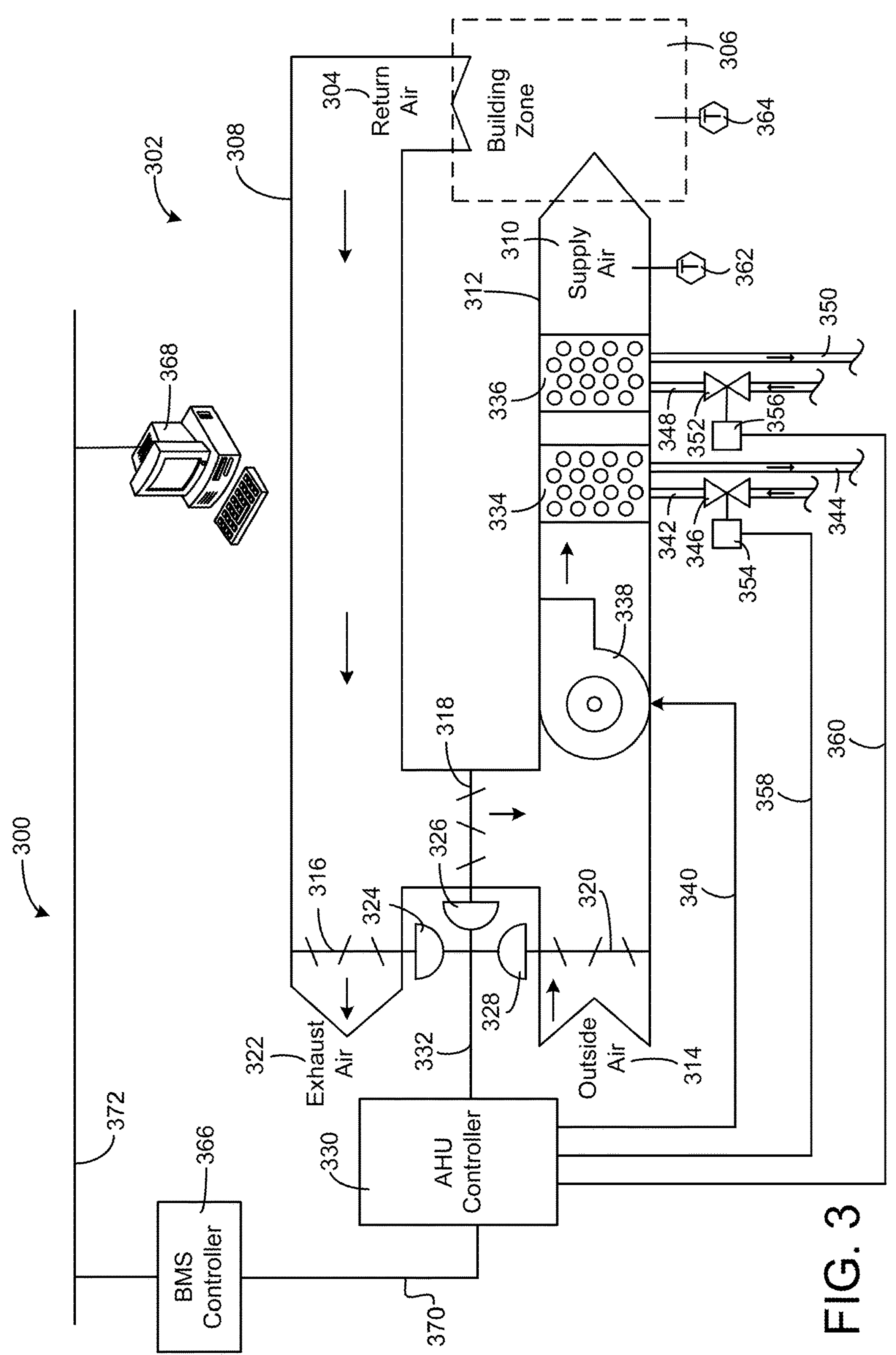
FIG. 3 is a block diagram of an airside system, according to some embodiments.

Referring now to FIG. 3, a block diagram of an airside system 300 is shown, according to some embodiments. In various embodiments, airside system 300 may supplement or replace airside system 130 in HVAC system 100 or can be implemented separate from HVAC system 100. When implemented in HVAC system 100, airside system 300 can include a subset of the HVAC devices in HVAC system 100 (e.g., AHU 106, VAV units 116, ducts 112-114, fans, dampers, etc.) and can be located in or around building 10. Airside system 300 may operate to heat or cool an airflow provided to building 10 using a heated or chilled fluid provided by waterside system 200.

In FIG. 3, airside system 300 is shown to include an economizer-type air handling unit (AHU) 302. Economizer-type AHUs vary the amount of outside air and return air used by the air handling unit for heating or cooling. For example, AHU 302 may receive return air 304 from building zone 306 via return air duct 308 and may deliver supply air 310 to building zone 306 via supply air duct 312. In some embodiments, AHU 302 is a rooftop unit located on the roof of building 10 (e.g., AHU 106 as shown in FIG. 1) or otherwise positioned to receive both return air 304 and outside air 314. AHU 302 can be configured to operate exhaust air damper 316, mixing damper 318, and outside air damper 320 to control an amount of outside air 314 and return air 304 that combine to form supply air 310. Any return air 304 that does not pass through mixing damper 318 can be exhausted from AHU 302 through exhaust damper 316 as exhaust air 322.

Each of dampers 316-320 can be operated by an actuator. For example, exhaust air damper 316 can be operated by actuator 324, mixing damper 318 can be operated by actuator 326, and outside air damper 320 can be operated by actuator 328. Actuators 324-328 may communicate with an AHU controller 330 via a communications link 332. Actuators 324-328 may receive control signals from AHU controller 330 and may provide feedback signals to AHU controller 330. Feedback signals can include, for example, an indication of a current actuator or damper position, an amount of torque or force exerted by the actuator, diagnostic information (e.g., results of diagnostic tests performed by actuators 324-328), status information, commissioning information, configuration settings, calibration data, and/or other types of information or data that can be collected, stored, or used by actuators 324-328. AHU controller 330 can be an economizer controller configured to use one or more control algorithms (e.g., state-based algorithms, extremum seeking control (ESC) algorithms, proportional-integral (PI) control algorithms, proportional-integral-derivative (PID) control algorithms, model predictive control (MPC) algorithms, feedback control algorithms, etc.) to control actuators 324-328.

Still referring to FIG. 3, AHU 302 is shown to include a cooling coil 334, a heating coil 336, and a fan 338 positioned within supply air duct 312. Fan 338 can be configured to force supply air 310 through cooling coil 334 and/or heating coil 336 and provide supply air 310 to building zone 306. AHU controller 330 may communicate with fan 338 via communications link 340 to control a flow rate of supply air 310. In some embodiments, AHU controller 330 controls an amount of heating or cooling applied to supply air 310 by modulating a speed of fan 338.

Cooling coil 334 may receive a chilled fluid from waterside system 200 (e.g., from cold water loop 216) via piping 342 and may return the chilled fluid to waterside system 200 via piping 344. Valve 346 can be positioned along piping 342 or piping 344 to control a flow rate of the chilled fluid through cooling coil 334. In some embodiments, cooling coil 334 includes multiple stages of cooling coils that can be independently activated and deactivated (e.g., by AHU controller 330, by BMS controller 366, etc.) to modulate an amount of cooling applied to supply air 310.

Heating coil 336 may receive a heated fluid from waterside system 200 (e.g., from hot water loop 214) via piping 348 and may return the heated fluid to waterside system 200 via piping 350. Valve 352 can be positioned along piping 348 or piping 350 to control a flow rate of the heated fluid through heating coil 336. In some embodiments, heating coil 336 includes multiple stages of heating coils that can be independently activated and deactivated (e.g., by AHU controller 330, by BMS controller 366, etc.) to modulate an amount of heating applied to supply air 310.

Each of valves 346 and 352 can be controlled by an actuator. For example, valve 346 can be controlled by actuator 354 and valve 352 can be controlled by actuator 356. Actuators 354-356 may communicate with AHU controller 330 via communications links 358-360. Actuators 354-356 may receive control signals from AHU controller 330 and may provide feedback signals to controller 330. In some embodiments, AHU controller 330 receives a measurement of the supply air temperature from a temperature sensor 362 positioned in supply air duct 312 (e.g., downstream of cooling coil 334 and/or heating coil 336). AHU controller 330 may also receive a measurement of the temperature of building zone 306 from a temperature sensor 364 located in building zone 306.

In some embodiments, AHU controller 330 operates valves 346 and 352 via actuators 354-356 to modulate an amount of heating or cooling provided to supply air 310 (e.g., to achieve a setpoint temperature for supply air 310 or to maintain the temperature of supply air 310 within a setpoint temperature range). The positions of valves 346 and 352 affect the amount of heating or cooling provided to supply air 310 by cooling coil 334 or heating coil 336 and may correlate with the amount of energy consumed to achieve a desired supply air temperature. AHU 330 may control the temperature of supply air 310 and/or building zone 306 by activating or deactivating coils 334-336, adjusting a speed of fan 338, or a combination of both.

Still referring to FIG. 3, airside system 300 is shown to include a building management system (BMS) controller 366 and a client device 368. BMS controller 366 can include one or more computer systems (e.g., servers, supervisory controllers, subsystem controllers, etc.) that serve as system level controllers, application or data servers, head nodes, or master controllers for airside system 300, waterside system 200, HVAC system 100, and/or other controllable systems that serve building 10. BMS controller 366 may communicate with multiple downstream building systems or subsystems (e.g., HVAC system 100, a security system, a lighting system, waterside system 200, etc.) via a communications link 370 according to like or disparate protocols (e.g., LON, BACnet, etc.). In various embodiments, AHU controller 330 and BMS controller 366 can be separate (as shown in FIG. 3) or integrated. In an integrated implementation, AHU controller 330 can be a software module configured for execution by a processor of BMS controller 366.

In some embodiments, AHU controller 330 receives information from BMS controller 366 (e.g., commands, setpoints, operating boundaries, etc.) and provides information to BMS controller 366 (e.g., temperature measurements, valve or actuator positions, operating statuses, diagnostics, etc.). For example, AHU controller 330 may provide BMS controller 366 with temperature measurements from temperature sensors 362-364, equipment on/off states, equipment operating capacities, and/or any other information that can be used by BMS controller 366 to monitor or control a variable state or condition within building zone 306.

Client device 368 can include one or more human-machine interfaces or client interfaces (e.g., graphical user interfaces, reporting interfaces, text-based computer interfaces, client-facing web services, web servers that provide pages to web clients, etc.) for controlling, viewing, or otherwise interacting with HVAC system 100, its subsystems, and/or devices. Client device 368 can be a computer workstation, a client terminal, a remote or local interface, or any other type of user interface device. Client device 368 can be a stationary terminal or a mobile device. For example, client device 368 can be a desktop computer, a computer server with a user interface, a laptop computer, a tablet, a smartphone, a PDA, or any other type of mobile or non-mobile device. Client device 368 may communicate with BMS controller 366 and/or AHU controller 330 via communications link 372.

Building Management System

Figure 4:
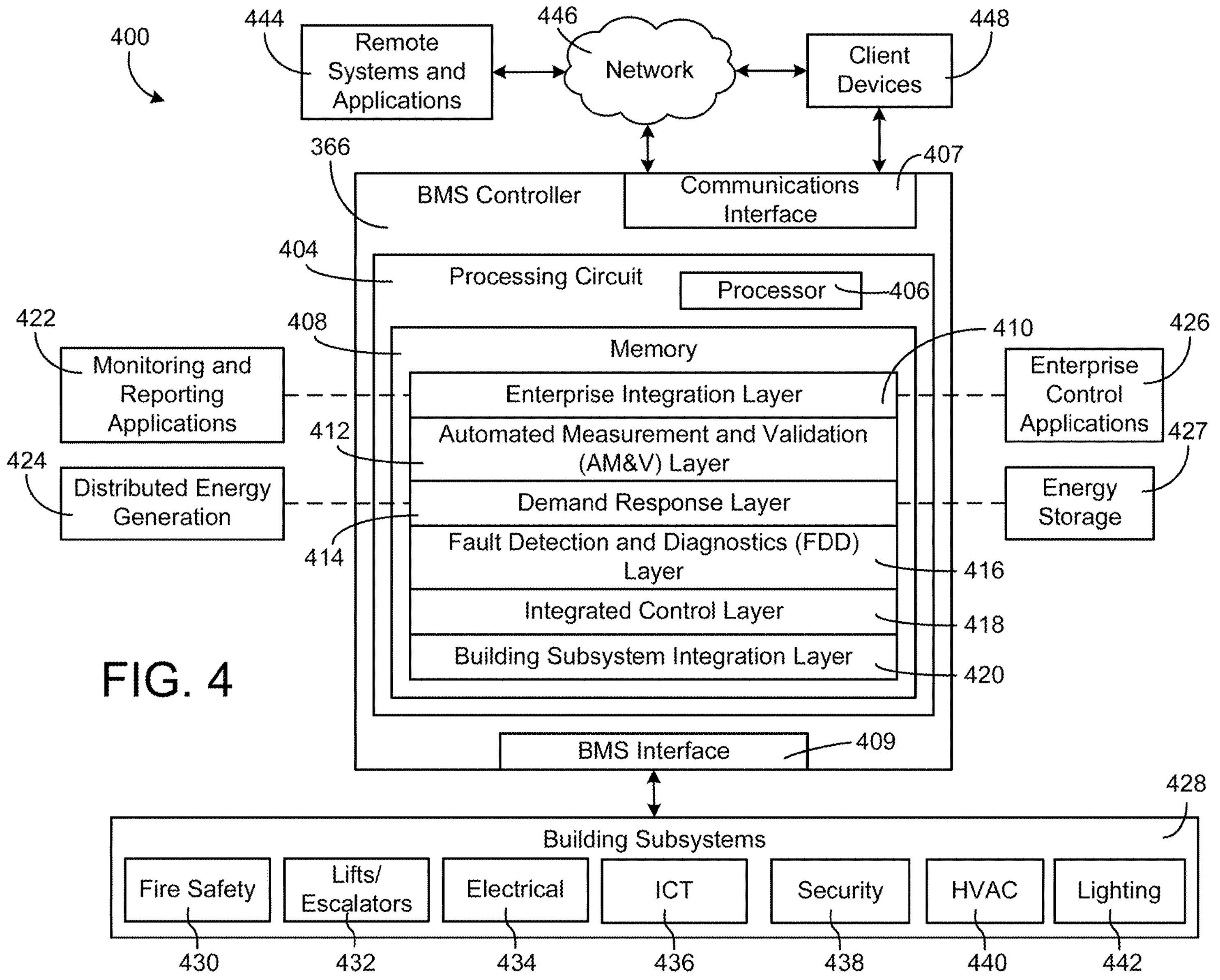
FIG. 4 is a block diagram of a building management system, according to some embodiments.

Referring now to FIG. 4, a block diagram of a building management system (BMS) 400 is shown, according to some embodiments. BMS 400 can be implemented in building 10 to automatically monitor and control various building functions. BMS 400 is shown to include BMS controller 366 and a plurality of building subsystems 428. Building subsystems 428 are shown to include a building electrical subsystem 434, an information communication technology (ICT) subsystem 436, a security subsystem 438, a HVAC subsystem 440, a lighting subsystem 442, a lift/escalators subsystem 432, and a fire safety subsystem 430. In various embodiments, building subsystems 428 can include fewer, additional, or alternative subsystems. For example, building subsystems 428 may also or alternatively include a refrigeration subsystem, an advertising or signage subsystem, a cooking subsystem, a vending subsystem, a printer or copy service subsystem, or any other type of building subsystem that uses controllable equipment and/or sensors to monitor or control building 10. In some embodiments, building subsystems 428 include waterside system 200 and/or airside system 300, as described with reference to FIGS. 2-3.

Each of building subsystems 428 can include any number of devices, controllers, and connections for completing its individual functions and control activities. HVAC subsystem 440 can include many of the same components as HVAC system 100, as described with reference to FIGS. 1-3. For example, HVAC subsystem 440 can include a chiller, a boiler, any number of air handling units, economizers, field controllers, supervisory controllers, actuators, temperature sensors, and other devices for controlling the temperature, humidity, airflow, or other variable conditions within building 10. Lighting subsystem 442 can include any number of light fixtures, ballasts, lighting sensors, dimmers, or other devices configured to controllably adjust the amount of light provided to a building space. Security subsystem 438 can include occupancy sensors, video surveillance cameras, digital video recorders, video processing servers, intrusion detection devices, access control devices and servers, or other security-related devices.

Still referring to FIG. 4, BMS controller 366 is shown to include a communications interface 407 and a BMS interface 409. Interface 407 may facilitate communications between BMS controller 366 and external applications (e.g., monitoring and reporting applications 422, enterprise control applications 426, remote systems and applications 444, applications residing on client devices 448, etc.) for allowing user control, monitoring, and adjustment to BMS controller 366 and/or subsystems 428. Interface 407 may also facilitate communications between BMS controller 366 and client devices 448. BMS interface 409 may facilitate communications between BMS controller 366 and building subsystems 428 (e.g., HVAC, lighting security, lifts, power distribution, business, etc.).

Interfaces 407, 409 can be or include wired or wireless communications interfaces (e.g., jacks, antennas, transmitters, receivers, transceivers, wire terminals, etc.) for conducting data communications with building subsystems 428 or other external systems or devices. In various embodiments, communications via interfaces 407, 409 can be direct (e.g., local wired or wireless communications) or via a communications network 446 (e.g., a WAN, the Internet, a cellular network, etc.). For example, interfaces 407, 409 can include an Ethernet card and port for sending and receiving data via an Ethernet-based communications link or network. In another example, interfaces 407, 409 can include a Wi-Fi transceiver for communicating via a wireless communications network. In another example, one or both of interfaces 407, 409 can include cellular or mobile phone communications transceivers. In some embodiments, communications interface 407 is a power line communications interface and BMS interface 409 is an Ethernet interface. In other embodiments, both communications interface 407 and BMS interface 409 are Ethernet interfaces or are the same Ethernet interface.

Still referring to FIG. 4, BMS controller 366 is shown to include a processing circuit 404 including a processor 406 and memory 408. Processing circuit 404 can be communicably connected to BMS interface 409 and/or communications interface 407 such that processing circuit 404 and the various components thereof can send and receive data via interfaces 407, 409. Processor 406 can be implemented as a general purpose processor, an application specific integrated circuit (ASIC), one or more field programmable gate arrays (FPGAs), a group of processing components, or other suitable electronic processing components.

Memory 408 (e.g., memory, memory unit, storage device, etc.) can include one or more devices (e.g., RAM, ROM, Flash memory, hard disk storage, etc.) for storing data and/or computer code for completing or facilitating the various processes, layers and modules described in the present application. Memory 408 can be or include volatile memory or non-volatile memory. Memory 408 can include database components, object code components, script components, or any other type of information structure for supporting the various activities and information structures described in the present application. According to some embodiments, memory 408 is communicably connected to processor 406 via processing circuit 404 and includes computer code for executing (e.g., by processing circuit 404 and/or processor 406) one or more processes described herein.

In some embodiments, BMS controller 366 is implemented within a single computer (e.g., one server, one housing, etc.). In various other embodiments BMS controller 366 can be distributed across multiple servers or computers (e.g., that can exist in distributed locations). Further, while FIG. 4 shows applications 422 and 426 as existing outside of BMS controller 366, in some embodiments, applications 422 and 426 can be hosted within BMS controller 366 (e.g., within memory 408).

Still referring to FIG. 4, memory 408 is shown to include an enterprise integration layer 410, an automated measurement and validation (AM&V) layer 412, a demand response (DR) layer 414, a fault detection and diagnostics (FDD) layer 416, an integrated control layer 418, and a building subsystem integration later 420. Layers 410-420 can be configured to receive inputs from building subsystems 428 and other data sources, determine control actions for building subsystems 428 based on the inputs, generate control signals based on the determined control actions, and provide the generated control signals to building subsystems 428. The following paragraphs describe some of the general functions performed by each of layers 410-420 in BMS 400.

Enterprise integration layer 410 can be configured to serve clients or local applications with information and services to support a variety of enterprise-level applications. For example, enterprise control applications 426 can be configured to provide subsystem-spanning control to a graphical user interface (GUI) or to any number of enterprise-level business applications (e.g., accounting systems, user identification systems, etc.). Enterprise control applications 426 may also or alternatively be configured to provide configuration GUIs for configuring BMS controller 366. In yet other embodiments, enterprise control applications 426 can work with layers 410-420 to optimize building performance (e.g., efficiency, energy use, comfort, or safety) based on inputs received at interface 407 and/or BMS interface 409.

Building subsystem integration layer 420 can be configured to manage communications between BMS controller 366 and building subsystems 428. For example, building subsystem integration layer 420 may receive sensor data and input signals from building subsystems 428 and provide output data and control signals to building subsystems 428. Building subsystem integration layer 420 may also be configured to manage communications between building subsystems 428. Building subsystem integration layer 420 translate communications (e.g., sensor data, input signals, output signals, etc.) across a plurality of multi-vendor/multi-protocol systems.

Demand response layer 414 can be configured to optimize resource usage (e.g., electricity use, natural gas use, water use, etc.) and/or the monetary cost of such resource usage in response to satisfy the demand of building 10. The optimization can be based on time-of-use prices, curtailment signals, energy availability, or other data received from utility providers, distributed energy generation systems 424, from energy storage 427 (e.g., hot TES 242, cold TES 244, etc.), or from other sources. Demand response layer 414 may receive inputs from other layers of BMS controller 366 (e.g., building subsystem integration layer 420, integrated control layer 418, etc.). The inputs received from other layers can include environmental or sensor inputs such as temperature, carbon dioxide levels, relative humidity levels, air quality sensor outputs, occupancy sensor outputs, room schedules, and the like. The inputs may also include inputs such as electrical use (e.g., expressed in kWh), thermal load measurements, pricing information, projected pricing, smoothed pricing, curtailment signals from utilities, and the like.

According to some embodiments, demand response layer 414 includes control logic for responding to the data and signals it receives. These responses can include communicating with the control algorithms in integrated control layer 418, changing control strategies, changing setpoints, or activating/deactivating building equipment or subsystems in a controlled manner. Demand response layer 414 may also include control logic configured to determine when to utilize stored energy. For example, demand response layer 414 may determine to begin using energy from energy storage 427 just prior to the beginning of a peak use hour.

In some embodiments, demand response layer 414 includes a control module configured to actively initiate control actions (e.g., automatically changing setpoints) which reduce energy costs based on one or more inputs representative of or based on demand (e.g., price, a curtailment signal, a demand level, etc.). In some embodiments, demand response layer 414 uses equipment models to determine a set of control actions. The equipment models can include, for example, thermodynamic models describing the inputs, outputs, and/or functions performed by various sets of building equipment. Equipment models may represent collections of building equipment (e.g., subplants, chiller arrays, etc.) or individual devices (e.g., individual chillers, heaters, pumps, etc.).

Demand response layer 414 may further include or draw upon one or more demand response policy definitions (e.g., databases, XML files, etc.). The policy definitions can be edited or adjusted by a user (e.g., via a graphical user interface) so that the control actions initiated in response to demand inputs can be tailored for the user's application, desired comfort level, particular building equipment, or based on other concerns. For example, the demand response policy definitions can specify which equipment can be turned on or off in response to particular demand inputs, how long a system or piece of equipment should be turned off, what setpoints can be changed, what the allowable setpoint adjustment range is, how long to hold a high demand setpoint before returning to a normally scheduled setpoint, how close to approach capacity limits, which equipment modes to utilize, the energy transfer rates (e.g., the maximum rate, an alarm rate, other rate boundary information, etc.) into and out of energy storage devices (e.g., thermal storage tanks, battery banks, etc.), and when to dispatch on-site generation of energy (e.g., via fuel cells, a motor generator set, etc.).

Integrated control layer 418 can be configured to use the data input or output of building subsystem integration layer 420 and/or demand response later 414 to make control decisions. Due to the subsystem integration provided by building subsystem integration layer 420, integrated control layer 418 can integrate control activities of the subsystems 428 such that the subsystems 428 behave as a single integrated supersystem. In some embodiments, integrated control layer 418 includes control logic that uses inputs and outputs from a plurality of building subsystems to provide greater comfort and energy savings relative to the comfort and energy savings that separate subsystems could provide alone. For example, integrated control layer 418 can be configured to use an input from a first subsystem to make an energy-saving control decision for a second subsystem. Results of these decisions can be communicated back to building subsystem integration layer 420.

Integrated control layer 418 is shown to be logically below demand response layer 414. Integrated control layer 418 can be configured to enhance the effectiveness of demand response layer 414 by enabling building subsystems 428 and their respective control loops to be controlled in coordination with demand response layer 414. This configuration may advantageously reduce disruptive demand response behavior relative to conventional systems. For example, integrated control layer 418 can be configured to assure that a demand response-driven upward adjustment to the setpoint for chilled water temperature (or another component that directly or indirectly affects temperature) does not result in an increase in fan energy (or other energy used to cool a space) that would result in greater total building energy use than was saved at the chiller.

Integrated control layer 418 can be configured to provide feedback to demand response layer 414 so that demand response layer 414 checks that constraints (e.g., temperature, lighting levels, etc.) are properly maintained even while demanded load shedding is in progress. The constraints may also include setpoint or sensed boundaries relating to safety, equipment operating limits and performance, comfort, fire codes, electrical codes, energy codes, and the like. Integrated control layer 418 is also logically below fault detection and diagnostics layer 416 and automated measurement and validation layer 412. Integrated control layer 418 can be configured to provide calculated inputs (e.g., aggregations) to these higher levels based on outputs from more than one building subsystem.

Automated measurement and validation (AM&V) layer 412 can be configured to verify that control strategies commanded by integrated control layer 418 or demand response layer 414 are working properly (e.g., using data aggregated by AM&V layer 412, integrated control layer 418, building subsystem integration layer 420, FDD layer 416, or otherwise). The calculations made by AM&V layer 412 can be based on building system energy models and/or equipment models for individual BMS devices or subsystems. For example, AM&V layer 412 may compare a model-predicted output with an actual output from building subsystems 428 to determine an accuracy of the model.

Fault detection and diagnostics (FDD) layer 416 can be configured to provide on-going fault detection for building subsystems 428, building subsystem devices (i.e., building equipment), and control algorithms used by demand response layer 414 and integrated control layer 418. FDD layer 416 may receive data inputs from integrated control layer 418, directly from one or more building subsystems or devices, or from another data source. FDD layer 416 may automatically diagnose and respond to detected faults. The responses to detected or diagnosed faults can include providing an alert message to a user, a maintenance scheduling system, or a control algorithm configured to attempt to repair the fault or to work-around the fault.

FDD layer 416 can be configured to output a specific identification of the faulty component or cause of the fault (e.g., loose damper linkage) using detailed subsystem inputs available at building subsystem integration layer 420. In other exemplary embodiments, FDD layer 416 is configured to provide "fault" events to integrated control layer 418 which executes control strategies and policies in response to the received fault events. According to some embodiments, FDD layer 416 (or a policy executed by an integrated control engine or business rules engine) may shut-down systems or direct control activities around faulty devices or systems to reduce energy waste, extend equipment life, or assure proper control response.

FDD layer 416 can be configured to store or access a variety of different system data stores (or data points for live data). FDD layer 416 may use some content of the data stores to identify faults at the equipment level (e.g., specific chiller, specific AHU, specific terminal unit, etc.) and other content to identify faults at component or subsystem levels. For example, building subsystems 428 may generate temporal (i.e., time-series) data indicating the performance of BMS 400 and the various components thereof. The data generated by building subsystems 428 can include measured or calculated values that exhibit statistical characteristics and provide information about how the corresponding system or process (e.g., a temperature control process, a flow control process, etc.) is performing in terms of error from its setpoint. These processes can be examined by FDD layer 416 to expose when the system begins to degrade in performance and alert a user to repair the fault before it becomes more severe.

Figure 5:
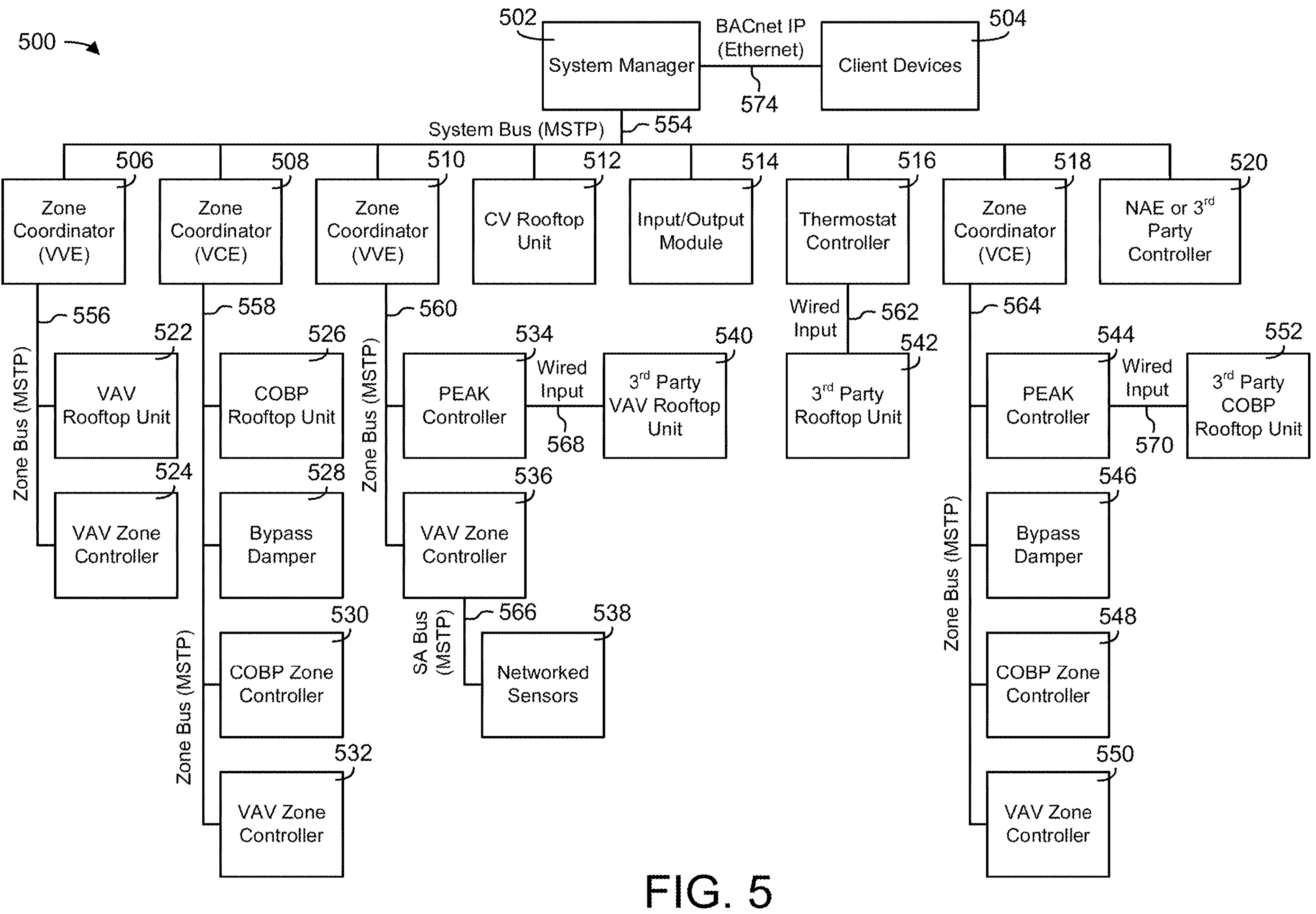
FIG. 5 is a block diagram of a smart building environment, according to some embodiments.

Referring now to FIG. 5, a block diagram of another building management system (BMS) 500 is shown, according to some embodiments. BMS 500 can be used to monitor and control the devices of HVAC system 100, waterside system 200, airside system 300, building subsystems 428, as well as other types of BMS devices (e.g., lighting equipment, security equipment, etc.) and/or HVAC equipment.

BMS 500 provides a system architecture that facilitates automatic equipment discovery and equipment model distribution. Equipment discovery can occur on multiple levels of BMS 500 across multiple different communications busses (e.g., a system bus 554, zone buses 556-560 and 564, sensor/actuator bus 566, etc.) and across multiple different communications protocols. In some embodiments, equipment discovery is accomplished using active node tables, which provide status information for devices connected to each communications bus. For example, each communications bus can be monitored for new devices by monitoring the corresponding active node table for new nodes. When a new device is detected, BMS 500 can begin interacting with the new device (e.g., sending control signals, using data from the device) without user interaction.

Some devices in BMS 500 present themselves to the network using equipment models. An equipment model defines equipment object attributes, view definitions, schedules, trends, and the associated BACnet value objects (e.g., analog value, binary value, multistate value, etc.) that are used for integration with other systems. Some devices in BMS 500 store their own equipment models. Other devices in BMS 500 have equipment models stored externally (e.g., within other devices). For example, a zone coordinator 508 can store the equipment model for a bypass damper 528. In some embodiments, zone coordinator 508 automatically creates the equipment model for bypass damper 528 or other devices on zone bus 558. Other zone coordinators can also create equipment models for devices connected to their zone busses. The equipment model for a device can be created automatically based on the types of data points exposed by the device on the zone bus, device type, and/or other device attributes. Several examples of automatic equipment discovery and equipment model distribution are discussed in greater detail below.

Still referring to FIG. 5, BMS 500 is shown to include a system manager 502; several zone coordinators 506, 508, 510 and 518; and several zone controllers 524, 530, 532, 536, 548, and 550. System manager 502 can monitor data points in BMS 500 and report monitored variables to various monitoring and/or control applications. System manager 502 can communicate with client devices 504 (e.g., user devices, desktop computers, laptop computers, mobile devices, etc.) via a data communications link 574 (e.g., BACnet IP, Ethernet, wired or wireless communications, etc.). System manager 502 can provide a user interface to client devices 504 via data communications link 574. The user interface may allow users to monitor and/or control BMS 500 via client devices 504.

In some embodiments, system manager 502 is connected with zone coordinators 506-510 and 518 via a system bus 554. System manager 502 can be configured to communicate with zone coordinators 506-510 and 518 via system bus 554 using a master-slave token passing (MSTP) protocol or any other communications protocol. System bus 554 can also connect system manager 502 with other devices such as a constant volume (CV) rooftop unit (RTU) 512, an input/output module (TOM) 514, a thermostat controller 516 (e.g., a TEC5000 series thermostat controller), and a network automation engine (NAE) or third-party controller 520. RTU 512 can be configured to communicate directly with system manager 502 and can be connected directly to system bus 554. Other RTUs can communicate with system manager 502 via an intermediate device. For example, a wired input 562 can connect a third-party RTU 542 to thermostat controller 516, which connects to system bus 554.

System manager 502 can provide a user interface for any device containing an equipment model. Devices such as zone coordinators 506-510 and 518 and thermostat controller 516 can provide their equipment models to system manager 502 via system bus 554. In some embodiments, system manager 502 automatically creates equipment models for connected devices that do not contain an equipment model (e.g., TOM 514, third party controller 520, etc.). For example, system manager 502 can create an equipment model for any device that responds to a device tree request. The equipment models created by system manager 502 can be stored within system manager 502. System manager 502 can then provide a user interface for devices that do not contain their own equipment models using the equipment models created by system manager 502. In some embodiments, system manager 502 stores a view definition for each type of equipment connected via system bus 554 and uses the stored view definition to generate a user interface for the equipment.

Each zone coordinator 506-510 and 518 can be connected with one or more of zone controllers 524, 530-532, 536, and 548-550 via zone buses 556, 558, 560, and 564. Zone coordinators 506-510 and 518 can communicate with zone controllers 524, 530-532, 536, and 548-550 via zone busses 556-560 and 564 using a MSTP protocol or any other communications protocol. Zone busses 556-560 and 564 can also connect zone coordinators 506-510 and 518 with other types of devices such as variable air volume (VAV) RTUs 522 and 540, changeover bypass (COBP) RTUs 526 and 552, bypass dampers 528 and 546, and PEAK controllers 534 and 544.

Zone coordinators 506-510 and 518 can be configured to monitor and command various zoning systems. In some embodiments, each zone coordinator 506-510 and 518 monitors and commands a separate zoning system and is connected to the zoning system via a separate zone bus. For example, zone coordinator 506 can be connected to VAV RTU 522 and zone controller 524 via zone bus 556. Zone coordinator 508 can be connected to COBP RTU 526, bypass damper 528, COBP zone controller 530, and VAV zone controller 532 via zone bus 558. Zone coordinator 510 can be connected to PEAK controller 534 and VAV zone controller 536 via zone bus 560. Zone coordinator 518 can be connected to PEAK controller 544, bypass damper 546, COBP zone controller 548, and VAV zone controller 550 via zone bus 564.

A single model of zone coordinator 506-510 and 518 can be configured to handle multiple different types of zoning systems (e.g., a VAV zoning system, a COBP zoning system, etc.). Each zoning system can include a RTU, one or more zone controllers, and/or a bypass damper. For example, zone coordinators 506 and 510 are shown as Verasys VAV engines (VVEs) connected to VAV RTUs 522 and 540, respectively. Zone coordinator 506 is connected directly to VAV RTU 522 via zone bus 556, whereas zone coordinator 510 is connected to a third-party VAV RTU 540 via a wired input 568 provided to PEAK controller 534. Zone coordinators 508 and 518 are shown as Verasys COBP engines (VCEs) connected to COBP RTUs 526 and 552, respectively. Zone coordinator 508 is connected directly to COBP RTU 526 via zone bus 558, whereas zone coordinator 518 is connected to a third-party COBP RTU 552 via a wired input 570 provided to PEAK controller 544.

Zone controllers 524, 530-532, 536, and 548-550 can communicate with individual BMS devices (e.g., sensors, actuators, etc.) via sensor/actuator (SA) busses. For example, VAV zone controller 536 is shown connected to networked sensors 538 via SA bus 566. Zone controller 536 can communicate with networked sensors 538 using a MSTP protocol or any other communications protocol. Although only one SA bus 566 is shown in FIG. 5, it should be understood that each zone controller 524, 530-532, 536, and 548-550 can be connected to a different SA bus. Each SA bus can connect a zone controller with various sensors (e.g., temperature sensors, humidity sensors, pressure sensors, light sensors, occupancy sensors, etc.), actuators (e.g., damper actuators, valve actuators, etc.) and/or other types of controllable equipment (e.g., chillers, heaters, fans, pumps, etc.).

Each zone controller 524, 530-532, 536, and 548-550 can be configured to monitor and control a different building zone. Zone controllers 524, 530-532, 536, and 548-550 can use the inputs and outputs provided via their SA busses to monitor and control various building zones. For example, a zone controller 536 can use a temperature input received from networked sensors 538 via SA bus 566 (e.g., a measured temperature of a building zone) as feedback in a temperature control algorithm. Zone controllers 524, 530-532, 536, and 548-550 can use various types of control algorithms (e.g., state-based algorithms, extremum seeking control (ESC) algorithms, proportional-integral (PI) control algorithms, proportional-integral-derivative (PID) control algorithms, model predictive control (MPC) algorithms, feedback control algorithms, etc.) to control a variable state or condition (e.g., temperature, humidity, airflow, lighting, etc.) in or around building 10.

Space Allocation System

Figure 6:
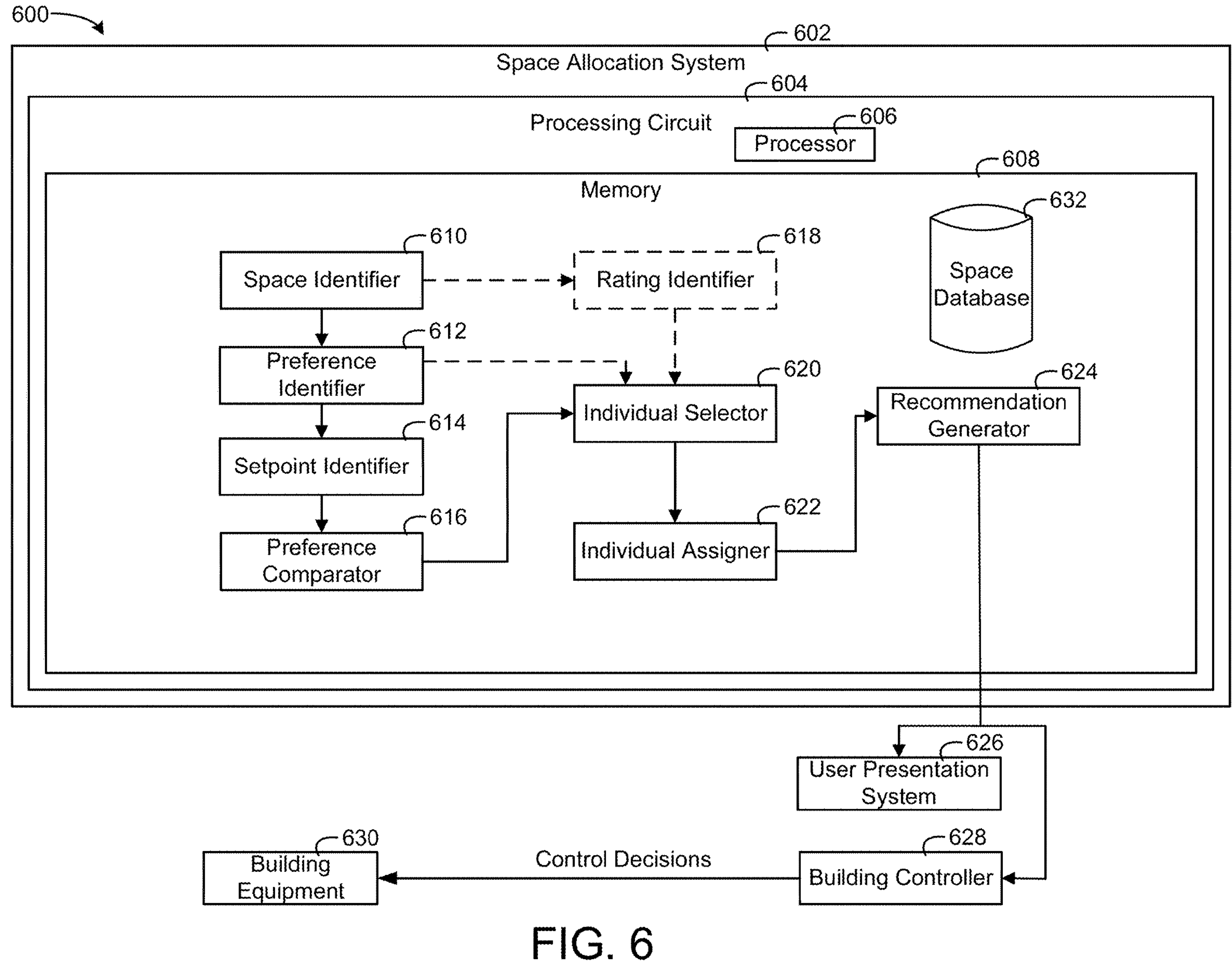
FIG. 6 is a block diagram of a system including a space allocation system, according to some embodiments.

Referring now to FIG. 6, a block diagram of a system 600 including a space allocation system 602 that is configured to generate recommendations reassigning individuals (e.g., people) to spaces in a building management system (e.g., BMS 400 or 500) is shown, according to an exemplary embodiment. Space allocation system 602 may implement a series of protocols to reassign individuals to different spaces to improve employee productivity and energy consumption of a building. Space allocation system 602 may do so based on preferences for different building characteristics (e.g., building points) and ratings for different spaces that the individuals have uploaded to space allocation system 602. Space allocation system 602 may reassign people from over-utilized spaces to under-utilized spaces as well as the entire occupancy of under-utilized spaces to other under-utilized spaces to do so.

As used herein, "points" or "data points" refer to sensor inputs, control outputs, control values, and/or different characteristics of the inputs and/or outputs. "Points" and/or "data points" may refer to various data objects relating to the inputs and the outputs such as BACnet objects. The objects may represent and/or include a point and/or group of points. The object may include various properties for each of the points. For example, an analog input may be a particular point represented by an object with one or more properties describing the analog input and another property describing the sampling rate of the analog input. For example, in some embodiments, a point is a data representation associated with a component of a BMS, such as, a camera, thermostat, controller, VAV box, RTU, valve, damper, chiller, boiler, AHU, supply fan, etc.

System 600 may include a user presentation system 626, a building controller 628, and building equipment 630. Building controller 628 may be similar to or the same as BMS controller 366. Space allocation system 602 may be a component of or be within building controller 628. In some embodiments, Space allocation system 602 operates in the cloud as one or more cloud servers. Components 602 and 626-628 may communicate over a network (e.g., a synchronous or asynchronous network).

Space allocation system 602 may include a processing circuit 604, a processor 606, and a memory 608. Processing circuit 604, processor 606, and/or memory 608 can be the same as, or similar to, processing circuit 404, processor 406, and/or memory 408, as described with reference to FIG. 4. Memory 608 may include a space identifier 610, a preference identifier 612, a setpoint identifier 614, a preference comparator 616, a rating identifier 618, an individual selector 620, an individual assigner 622, a recommendation generator 624, and/or a space database 632. Memory 608 may include any number of components. Each of these components may operate to identify over-utilized and under-utilized spaces and reassign individuals between the spaces to improve the energy efficiency of a building and/or to improve employee productivity.

Space identifier 610 can include instructions performed by one or more servers or processors (e.g., processing circuit 604), in some embodiments. Space identifier 610 can be configured to identify spaces and the number of individuals that are assigned to the identified spaces from space database 632. Space identifier 610 can identify under-utilized spaces as spaces that have been assigned a number of people below an under-utilization threshold. Space identifier 610 can identify over-utilized spaces as spaces that have been assigned a number of people above an over-utilization threshold.

To identify under-utilized and over-utilized spaces, space identifier 610 can retrieve the identifications of spaces of the building or profiles of the spaces and identify the individuals that have been assigned to the spaces from space database 632. For each space, space identifier 610 may increment a counter for each individual that is assigned to the space. Space identifier 610 may compare the count of the counter to the under-utilization threshold and/or the over-utilization threshold to identify the under-utilized spaces and the over-utilized spaces of the building.

Space database 632 may be or include a database such as a relational database that stores data structures and/or profiles for individuals and/or spaces. For instance, space database 632 may store profiles for different individuals that contain information about the individuals such as his or her name, an identification number, and/or a space assignment. In some embodiments, space database 632 may store preferences and/or space ratings for the different individuals. Space database 632 may receive and store such preferences and/or space ratings after the individuals upload them to space allocation system 602. For example, an individual's profile may include a list of the individual's preferences for building characteristics or setpoints such as a preferred temperature, humidity, luminescence, etc. The individual's profile may also include a list of the individual's ratings for the different spaces of the building (e.g., numerical ratings within a certain range such as 1-10 or 1-100).

Space database 632 may also store profiles for different spaces that contain information about the spaces such as the spaces' dimensions, space types (e.g., conference room, hallway, workspace, bathroom, kitchen, etc.), and/or the people assigned to each space. In some embodiments, the space profiles may include the over-utilization and/or under-utilization thresholds for the respective spaces that space identifier 610 may retrieve to identify the spaces that are under-utilized and/or over-utilized. In some embodiments, the space profiles may store indications of whether the spaces are over-utilized or under-utilized. Space identifier 610 may identify the indications when determining whether the spaces are under-utilized or over-utilized.

In operation, space identifier 610 may identify spaces from space database 632 and determine whether the spaces are under-utilized or over-utilized in response to detecting an event occurred. For example, space identifier 610 may determine under-utilized and/or over-utilized spaces in response to assigning a new individual to a space. Other examples of events may be a time interval from a previous space reassignment ending, a user input at a user interface, a signal from another system, etc. In response to detecting such an event, space identifier 610 may identify an under-utilized space and an over-utilized space from space database 632 so space allocation system 602 can determine whether to move or reassign individuals from the over-utilized space to the under-utilized space.

Preference identifier 612 can include instructions performed by one or more servers or processors (e.g., processing circuit 604), in some embodiments. Preference identifier 612 can be configured to identify the preferences of the individuals in the over-utilized space for different space characteristics. Preference identifier 612 may identify such preferences by identifying the profiles of the individuals in the over-utilized space that was identified by space identifier 610 and retrieving the preferences from the profiles.

Setpoint identifier 614 can include instructions performed by one or more servers or processors (e.g., processing circuit 604), in some embodiments. Setpoint identifier 614 can be configured to identify the setpoints for the under-utilized space for different space characteristics. Setpoint identifier 614 may identify such setpoints by identifying the profiles of the under-utilized space that was identified by space identifier 610 and retrieving the setpoints from the space's profile. In some embodiments, instead of retrieving the setpoints for the space, the setpoint identifier 614 determines the average and/or median value of the different characteristics (e.g., temperature, humidity, luminescence, light intensity, etc.) over a predetermined time period (e.g., the average temperature within a space for the past month or year). Setpoint identifier 614 can do so by retrieving the average value from space database 632 or retrieving characteristic values about the space over the time period and determining the average or median from the retrieved values. In some embodiments, the setpoints and/or values may only be values collected from or for working or occupied hours (e.g., from 8 AM to 5 PM) and/or days (e.g., Monday-Friday).

Preference comparator 616 can include instructions performed by one or more servers or processors (e.g., processing circuit 604), in some embodiments. Preference comparator 616 can be configured to compare the preferences that were retrieved by preference identifier 612 and compare the preferences to the setpoints or other values that were determined by setpoint identifier 614. Based on the comparison, setpoint identifier 614 can determine differences between the preferences and the setpoints, average values, and/or median values. Setpoint identifier 614 can send the determined differences to individual selector 620 for further processing.

In some embodiments, space allocation system 602 may include rating identifier 618. Rating identifier 618 can include instructions performed by one or more servers or processors (e.g., processing circuit 604), in some embodiments. Rating identifier 618 can be configured to identify ratings that the individuals assigned to the over-utilized space provided for the under-utilized space. Rating identifier 618 may identify the ratings from the individuals' profiles in space database 632. In some embodiments, rating identifier 618 may also identify a maximum rating for the under-utilized space. Rating identifier 618 may identify the maximum rating from the space's profile from a setting or flag in space database 632 or as the highest rating that the individuals in the over-utilized space provided for the under-utilized space. Upon identifying the ratings for the individuals in the over-utilized space and/or the highest rating for the space, for each individual, rating identifier 618 may determine a difference between the individual's rating for the space and the highest rating. Rating identifier 618 may transmit the difference to individual selector 620.

Individual selector 620 can include instructions performed by one or more servers or processors (e.g., processing circuit 604), in some embodiments. Individual selector 620 can be configured to receive the differences from preference comparator 616 and/or rating identifier 618 and select the individuals in the over-utilized space to reassign to the under-utilized space. In some embodiments, individual selector 620 may do so by applying the differences to an objective function such as:

$$\min_{P^*}\sum_{P\subseteq O}\left[w_t(Temp_p - Temp_i^{avg})^2 + w_L(Lum_p - Lum_i^{avg})^2 + w_o(\text{Other}_p - \text{Other}_i^{avg})^2 + w_f(Pref_{p,i} - Pref_i^{max})^2 + \ldots\right]$$

where P* is the number and/or specific people for which the objective function is being evaluated, P is the specific individual being evaluated, $w_t$ is a weight for a temperature building characteristic, $Temp_p$ is individual P's preferred space temperature, $$Temp_i^{avg}$$

is the average space temperature of space i, $w_L$ is a weight for a luminescence building characteristic, $Lum_p$ is individual P's preferred space luminescence, $$Lum_i^{avg}$$

is the average space luminescence of space i, $w_o$ is a weight for an "other" building characteristic (e.g., any other building point or characteristic of the space), $Other_p$ is individual P's preferred value for the space characteristic, $$Other_i^{avg}$$

is the average value for the other space characteristic of space i, $w_f$ is a weight for a rating of an individual P for space i, $Pref_{p,i}$ is individual P's rating for space i, and $$Pref_i^{max}$$

is the maximum rating for space i (e.g., the maximum possible preference or maximum preference of all of the individuals in the over-utilized space). The objective function may similarly use any number of building characteristics. The weights of the objective function may be predetermined (e.g., input by a user) and stored in memory of the data processing system.

In some embodiments, an administrator may input weights for the different building characteristics based on the administrator's perceived importance of the characteristic. For example, an administrator may input a higher weight for a space temperature preference than for a space luminescence preference because the administrator believes space temperature is more important to comfortability than luminescence. In some embodiments, the administrator may apply the highest weight to the space rating category for similar reasons. Thus, the administrator may use weights that are specific to individual building characteristics to improve the accuracy of the objective function in determining the subset of people to reassign to the under-utilized space.

In some embodiments, the individuals themselves may input the weights for the different building characteristics and/or ratings. For instance, the individual may provide a numerical value (e.g., a numerical value on a predetermined scale) or a percentage for different building characteristics and/or the rating indicating how important the characteristic is to their productivity and/or comfortability. Space allocation system 602 may store the numerical values in the individuals' profiles in space database 632 as weights. In these embodiments, individual selector 620 may determine the weights for the different individuals on an individual basis by retrieving the weights for each individual and using the retrieved weights in the objective function, thus providing individualized prediction scores for the individuals of the over-utilized spaces.

When using the objective function, individual selector 620 may determine a prediction score for each individual in the over-utilized space. The prediction score may be a comparative indicator of whether to move an individual from the over-utilized space to the under-utilized space. For example, individual selector 620 may determine prediction scores for the individuals in the over-utilized space. Individual selector 620 may compare the prediction scores of the individuals and rank the individuals based on their prediction scores where individuals with higher prediction scores are ranked lower. Individual selector 620 may determine the number of people that are assigned to the over-utilized space above the over-utilization threshold for the space and select the determined number of people with the lowest prediction scores. For example, if the over-utilized space has 20 people assigned to the space and the over-utilization threshold for the space is 16 people, individual selector 620 may determine to move four people from the over-utilized space to the under-utilized space. When doing so, individual selector 620 may select the four people with the lowest prediction score. Individual selector 620 may select any number of people to move from the over-utilized space.

Individual assigner 622 can include instructions performed by one or more servers or processors (e.g., processing circuit 604), in some embodiments. Individual assigner 622 can be configured to update space database 632 to indicate the selected individuals from the over-utilized space have been reassigned to the under-utilized space. In some embodiments, to do so, individual assigner 622 may update the profiles of the reassigned individuals to indicate the new space assignment for the individuals. For example, individual assigner 622 may update a value in the individual's profile that indicates their space assignment to indicate the new space assignment. In some embodiments, individual assigner 622 may additionally or instead update the space profiles of the over-utilized space and the under-utilized space to indicate the individuals have been reassigned to the under-utilized space. Individual assigner 622 may do so by adding the reassigned individuals to the profile of the under-utilized space and/or removing the reassigned individuals from the over-utilized space. Thus, space allocation system 602 may maintain an accurate record of the individuals that are assigned to different spaces in the building.

Recommendation generator 624 can include instructions performed by one or more servers or processors (e.g., processing circuit 604), in some embodiments. Recommendation generator 624 can be configured to generate recommendations to move or reassign individuals to different spaces within the building. Recommendation generator 624 may generate such recommendations instead of or in addition to individual assigner 622 reassigning the individuals to different spaces in space database 632. Recommendation generator 624 may generate a recommendation as a record (e.g., a file, document, table, listing, message, notification, etc.) with text or a string that indicates the individuals that are being reassigned and the space to which they are being reassigned. Recommendation generator 624 may generate such a record and transmit the record to user presentation system 626 for display and/or building controller 628 to update the equipment configurations of the under-utilized space and the over-utilized space according to the reassignment.

In some embodiments, in cases in which space identifier 610 is not able to identify any over-utilized spaces from space database 632, space identifier 610 may instead identify two under-utilized spaces. Upon doing so, rating identifier 618 may identify the space ratings of individuals for one or both of the two under-utilized spaces from space database 632. In one example, rating identifier 618 may identify the ratings that the individuals of one of the under-utilized spaces provided for the other under-utilized space.

Individual selector 620 may identify the ratings that were identified by rating identifier 618 and aggregate the ratings. Individual selector 620 may compare the two aggregate ratings to determine which space has individuals that rated the other space the highest. As an example, individual selector 620 may perform these operations according to the equation:

$$\sum_{tot\ occ\_i} Pref^{k}_{occ\_i} \leq \sum_{tot\ occ\_k} Pref^{i}_{occ\_k}$$

where tot occ_i means the total occupancy of space i, $$Pref^{k}_{occ\_i}$$

is the rating of a particular occupant of space i for space k, tot occ_k means the total occupancy of space k, and $$Pref^{i}_{occ\_k}$$

is the rating of a particular occupant of space k for space i. i and k represent the two under-utilized spaces. In some embodiments, individual selector 620 aggregates the space ratings of the individuals for both their own space and the other space and move all the individuals of the spaces to the space with the highest aggregate rating.

Upon identifying the higher rated under-utilized space, individual selector 620 may select the entire occupancy of the lower rated space to move to the higher rated space. Individual assigner 622 may move or reassign the selected individuals to the higher rated space by updating the profiles of the selected individuals and/or the two spaces in space database 632 to indicate the individuals have been moved. Recommendation generator 624 may then generate a record with a recommendation to move the individuals and send the record to user presentation system 626 for presentation to an administrator on a display. In some embodiments, recommendation generator 624 may send the recommendation to building controller 628 to indicate the new occupancies in each space so building controller 628 can control the corresponding building equipment 630 for each space accordingly.

FIG. 7 is a flow diagram of a process 700 for balancing people between spaces of a building, according to some embodiments. Process 700 may be performed by a data processing system (e.g., space allocation system 602). Process 700 may include any number of steps and the steps may be performed in any order. At a step 702, the data processing system may identify an under-utilized space i. The data processing system may identify the under-utilized space i from a list of spaces that is stored in memory of the data processing system. For example, the data processing system may store identifications of spaces of a building in memory (e.g., in a database or another data structure). In some embodiments, the data processing system may additionally store indications of the number of people that have been assigned to the individual spaces (e.g., have stored associations with the spaces). In such embodiments, the data processing system may retrieve the number of people that have been assigned to each respective space as well as an under-utilization threshold (e.g., a global threshold that applies to all the spaces of the building, a threshold that applies to the type of the respective space, or a threshold that applies only to the respective space). For the retrieved spaces, the data processing system may compare the number of people assigned to the spaces to the respective retrieved under-utilization thresholds. The data processing system may determine any spaces with a number of people assigned to the space that is less than the under-utilization threshold is under-utilized. Upon making this determination for a space, the data processing system may store an indication in memory indicating the space is under-utilized.

In some embodiments, in instances in which the data processing system has previously determined a space is under-utilized or a user has input an indication that the space is under-utilized, the data processing system may determine the space is under-utilized by identifying the under-utilized indication that is associated with the space. For example, the data processing system may receive a request to balance the utilization between different spaces of the building. The data processing system may in turn retrieve the under-utilized space i from memory responsive to the under-utilized space i being associated with an underutilized space indication.

In some embodiments, the data processing system may compare the number of people of an under-utilized space to an over-utilization threshold (e.g., a global threshold that applies to all the spaces of the building, a threshold that applies to the type of the space, or a threshold that applies only to the respective space) of the space. By doing so, the data processing system may determine a difference between the number of people and the over-utilization threshold as the availability of the space. The data processing system may store the availabilities for the spaces in memory.

In some embodiments, to identify the under-utilized space i, the data processing system may generate a list of under-utilized spaces and identify the under-utilized space i from the list. For example, the data processing system may determine there are multiple under-utilized spaces in the building by comparing the numbers of individuals assigned to the spaces to under-utilization thresholds and/or by retrieving under-utilized space indications from memory. The data processing system may generate a list of the under-utilized spaces and compare the availabilities between the under-utilized spaces. The data processing system may identify the under-utilized space i responsive to the under-utilized space i having the highest availability on the list.

At a step 704, the data processing system may compute the availability. For instance, the data processing system may compute the availability of the space by retrieving the availability from memory. In some embodiments, instead of identifying the under-utilized space i based on the space having the highest availability, the data processing system may pseudo-randomly select the under-utilized space i from memory and compute availability of the space after the selection. In some embodiments, step 704 is performed during step 702 when the data processing system determines availabilities for the under-utilized spaces to generate a ranked list of the under-utilized spaces.

At a step 706, the data processing system may determine whether there any over-utilized spaces in the building. The data processing system may make this determination similar to how the data processing system identified the under-utilized space i. For example, for each space in the building (or the spaces that were determined not to be under-utilized during steps 702-704), the data processing system may retrieve or determine a number of people that have been assigned to the space and an over-utilization threshold. The over-utilization threshold may indicate the maximum number of people that can be assigned to a space before the space is considered to be over-utilized. The data processing system can compare the number of people assigned to a space to the space's respective over-utilization threshold and determine the space to be over-utilized if the number of people reaches or exceeds the over-utilization threshold. Upon making this determination for a space, the data processing system may store an indication in memory indicating the space is over-utilized.

In some embodiments, the data processing system may generate a list of over-utilized spaces and select the over-utilized space j from the list in response to the over-utilized space j having the largest size of over-population (e.g., number of people assigned to the space above the respective over-utilization threshold). For example, the data processing system may generate a list of over-utilized spaces and rank or order the list based on the size of over-population of each of the spaces. The data processing system may identify the over-utilized space j as the space with the highest size of over-population to move or reassign people to the under-utilized space i.

At a step 708, for each over-utilized space, the data processing system may calculate the size of the over-population of the over-utilized space j. The data processing system may do so by comparing the number of people assigned to the over-utilized space j to the space's threshold and determining the difference to be the size of the over-population of the space. The data processing system may store an indication of the size of the over-population of the over-utilized space j in memory upon making this determination. In some embodiments, the data processing system may calculate the size of the over-population while it performs step 706. In such embodiments, the data processing system may calculate the size and store an indication of the size in memory so the indication can later be retrieved.

At a step 710, the data processing system may determine if the availability of the under-utilized space i exceeds the size of the over-population of the over-utilized space j. For instance, the data processing system may retrieve the availability of the under-utilized space i and the size of the over-population of the over-utilized space j and compare the availability to the size. Responsive to determining the availability is less than the size, the data processing system may return to step 708 and calculate the over-population size for another over-populated space. The data processing system may repeat steps 708 and 710 until it determines the availability of the under-utilized space i is greater than or equal to the size of an over-populated space.

Upon determining the availability of the under-utilized space is greater than or equal to the size of the over-population of the over-utilized space j (or another over-utilized space), at a step 712, the data processing system may select a subset of people from the over-utilized space j to move or reassign to the under-utilized space i. To do so, the data processing system may evaluate the preferences of the people in the over-utilized space j against the operating conditions (e.g., the setpoints) or the median or average values of building characteristics of the under-utilized space i. For example, in some embodiments, the data processing system may evaluate the preferences against the operating conditions using an objective function such as:

$$\min_{P^*}\sum_{P\subseteq O}\left[w_t\left(Temp_p - Temp_i^{avg}\right)^2 + w_L(Lum_p - Lum_i^{avg})^2 + w_o(\text{Other}_p - \text{Other}_i^{avg})^2 + w_f\left(Pref_{p,i} - Pref_i^{max}\right)^2 + \ldots\ \right]$$

where P* is the number and/or specific people for which the objective function is being evaluated, P is the specific individual being evaluated, $w_t$ is a weight for a temperature building characteristic, $Temp_p$ is individual P's preferred space temperature, $$Temp_i^{avg}$$

is the average space temperature of space i, $w_L$ is a weight for a luminescence building characteristic, $Lum_p$ is individual P's preferred space luminescence, $$Lum_i^{avg}$$

is the average space luminescence of space i, $w_o$ is a weight for an "other" building characteristic (e.g., any other building point or characteristic of the space), $Other_p$ is individual P's preferred value for the space characteristic, $$Other_i^{avg}$$

is the average value for the other space characteristic of space i, $w_f$ is a weight for a rating of an individual P for space i, $Pref_{p,i}$ is individual P's rating for space i, and $$Pref_i^{max}$$

is the maximum rating for space i (e.g., the maximum possible rating or maximum rating of all of the individuals in the over-utilized space). The objective function may similarly use any number of building characteristics. The weights of the objective function may be predetermined (e.g., input by a user) and stored in memory of the data processing system.

The data processing system may apply the aforementioned objective function by retrieving the values for the individuals' preferences and the average values of the corresponding building spaces from memory. For instance, in some embodiments, individuals may fill out forms on a user interface to indicate their preferred values for different building characteristics (e.g., their preferred space temperature, luminescence, humidity, airflow, etc.). The individuals may submit their preferences to the data processing system, which may receive the preferences and store them in memory. In some embodiments, individuals may additionally provide ratings or rankings for different spaces in the building in the same forms and upload their ratings or rankings to the data processing system. In some embodiments, instead of filling out the forms online, individuals may fill out a paper copy of their preferences and/or ratings and scan in a copy of their ratings. The data processing system may receive the scan, identify the rating using object character recognition techniques, and store the values in memory. The data processing system may store an association between the corresponding preference data and the individuals that provided the data (e.g., in stored profiles for the individuals, which may also include indications of the spaces to which the individuals are assigned).

In some embodiments, the data processing system may apply the objective function for each individual in the over-populated space. For example, in some embodiments, the data processing system may identify the stored preferences for each individual, as well as weights for different building characteristics, and the average values for the building characteristics from memory. The data processing system may apply the objective function above to the values for each individual to determine prediction scores for each of the individuals. The data processing system may identify the individuals with the lowest prediction scores to move from the over-utilized space j to the under-utilized space i. When doing so, the data processing system may identify a number of people to move as the size of the over-population of the over-utilized space j or the availability of the under-utilized space i. Thus, the data processing system may identify the people that would be happiest (and potentially the most productive) in the under-utilized space i while lowering the population of the over-utilized space j to an amount potentially below the over-utilization threshold. Consequently, the people within the previously over-utilized space j may be more productive.

In some embodiments, instead of updating a data structure or profile to move the individuals, the data processing system may generate a recommendation to move the individuals. For example, the data processing system may determine the individuals to move from the over-utilized space j and then generate a file or user interface that displays a list of the identified individuals. The data processing system may display the list to a user and the user may verbally assign the recommended individuals to the new spaces or update the data structures indicating the assignments via a user input.

In some embodiments, the data processing system may adjust a configuration of the building equipment in the previously over-utilized space responsive to reassigning the individuals from the space. For instance, HVAC equipment may operate differently depending on the number of people in the space (e.g., equipment that is operating to keep a temperature at a constant temperature may use more energy to do so in a crowded space with a lot of body heat). Accordingly, the data processing system may be configured to operate differently based on the number of people in the space either based on the number of people themselves, or based on the temperature of the space (e.g., which may increase depending on the number of people in the space). The data processing system may have a stored table that indicates different configurations for the equipment based on the number of people and/or the current temperature. As the temperature or the number of people in the space changes, the data processing system may compare the new temperature or number of people to the table and identify configurations or operating parameters for building equipment based on the comparison. The data processing system may send control signals to the respective building equipment to help maintain desired setpoints in the space over time.

Advantageously, by moving the individuals in over-utilized spaces to under-utilized spaces, the systems and methods may enable the equipment operating in the spaces to perform with higher efficiency. For example, often, when there are a large number of people in a space, the body heat of the individuals may cause the natural temperature of the space to increase. In smart building systems that have a space temperature setpoint, the large number of people may cause the equipment that operates to affect the setpoint to use more energy to maintain a pseudo-constant temperature around the setpoint. However, in under-utilized spaces, there may not be a corresponding benefit to having too few individuals in the space because the system may still need to work to maintain the setpoint. The lack of people may cause the people to have a minimal effect on the natural temperature of the space. Thus, by moving individuals from an over-utilized space to an under-utilized space, the system may enable the equipment operating in the over-utilized space to use less energy without substantially impacting the amount of energy the equipment that is operating in the under-utilized space uses.

Returning to step 706, responsive to the data processing system determining there is not an over-utilized space in the building, at a step 716, the data processing system may determine whether there is another under-utilized space in the building. To do so, the data processing system may analyze the list of under-utilized spaces and determine if there is another space on the list. If the data processing system is not able to identify another under-utilized space on the list, at a step 718, the data processing system may generate an alert indicating there is not another space to move individuals. The data processing system may transmit the alert to a user device to display the alert on a user interface.

However, if the data processing system is able to identify another space on the list, at a step 720, the data processing system may identify an under-utilized space k from the list, in some embodiments responsive to the under-utilized space k having the next highest availability, the highest occupancy (e.g., the number of people assigned to space), or the lowest availability or occupancy). The data processing system may determine if the availability of the under-utilized space i is higher than the occupancy of space k (e.g., the number of people that are assigned to space k). To do so, the data processing system may compare the availability of the under-utilized space i to the occupancy of the space k. If the availability is lower than the occupancy, at step 722, the data processing system may determine whether there is another under-utilized space in the building. For example, the data processing system may examine the list of under-utilized spaces and determine if there is another under-utilized space on the list. Responsive to not being able to identify another under-utilized space, the data processing system may return to step 718 and generate an alert that two different under-utilized spaces could not be identified to merge together.

However, if the data processing system determines space i has a higher availability than the occupancy of space k, at a step 724, the data processing system may determine whether the people assigned to space k have a higher preference for space i than the people assigned to space i have for space k. For instance, the data processing system may retrieve the ratings (e.g., numerical ratings) that the individuals in space i and k have for the opposite spaces from memory. The individuals may have previously provided these preferences via a user interface or by uploading a form, as described above. The data processing system may evaluate the ratings according to the following equation:

$$\sum_{tot\ occ\_i} Pref^{k}_{occ\_i} \leq \sum_{tot\ occ\_k} Pref^{i}_{occ\_k}$$

where tot occ_i means the total occupancy of space i, $$Pref^{k}_{occ\_i}$$

is the rating of a particular occupant of space i for space k, tot occ_k means the total occupancy of space k, and $$Pref^{i}_{occ\_k}$$

is the rating of a particular occupant of space k for space i. In other words, the data processing separately aggregates the ratings the occupants of space i have for space k and the ratings the occupants of space k have for space i. In some embodiments, if the ratings for space k are higher, the data processing system may return to step 722 to identify another under-utilized space to which space k's occupants can be assigned. In some embodiments, if the ratings for space k are higher, the data processing system may determine if the availability of space k is higher than the occupancy of space i. If the data processing system determines the availability of space k is higher, the data processing system may continue to step 726 but move the occupants of space k to space i instead. However, if the data processing system determines the availability of space k is lower, the data processing system may return to step 722 to identify another under-utilized space i.

If the data processing system determines the preferences for space i are higher than the preferences for space k, at a step 726, the data processing system may move the current occupancy of space k to space i. The data processing system may move the current occupancy of space k to space i by updating a data structure in memory that indicates the space assignments for different individuals. For example, in some embodiments, the data processing system may identify profiles of the individuals in space k and update the space assignment values in their profiles to indicate that they are now assigned to space i. In some embodiments, the data processing system may update the profiles of the spaces to indicate the individuals that were reassigned between the spaces. In some embodiments, instead of automatically updating their profiles, the data processing system may generate a recommendation in a record. The data processing system may generate the record on a user interface that an administrator may view and use to manually update the different individuals' profiles to indicate the move. In some cases, the administrator may view the recommendation and inform the individuals of their new space assignments. In this way, the data processing system may move all of the individuals from space k to space i to cause space k to be unoccupied.

At a step 728, the data processing system may recommend repurposing space k. For example, after the data processing system moves the people in space k to space i, space k may be available to be repurposed into another type of space. Each space type may correspond to different space features such as location within the building and/or dimensions of the space. The data processing system may compare the features to a database and identify a space type that matches the features. The data processing system may then generate a recommendation on a user interface indicating to re-purpose the space to the identified space type.

In some embodiments, the data processing system may turn the equipment that operates space k into an unoccupied mode upon moving the individuals from the space. For example, the data processing system may identify the different equipment that affects characteristics of the space such as HVAC equipment and lighting equipment. The data processing system may then modify the identified equipment's operating parameters to an unoccupied mode (e.g., an energy savings mode or an off mode). By doing so, the data processing system may save energy while still maintaining the comfortability of the building's inhabitants because the inhabitants may still benefit from the equipment that affects the spaces that they occupy. Further, the equipment that was previously operating to maintain the comfortability of the now unoccupied space may be off and/or use significantly less energy.

Figure 8:
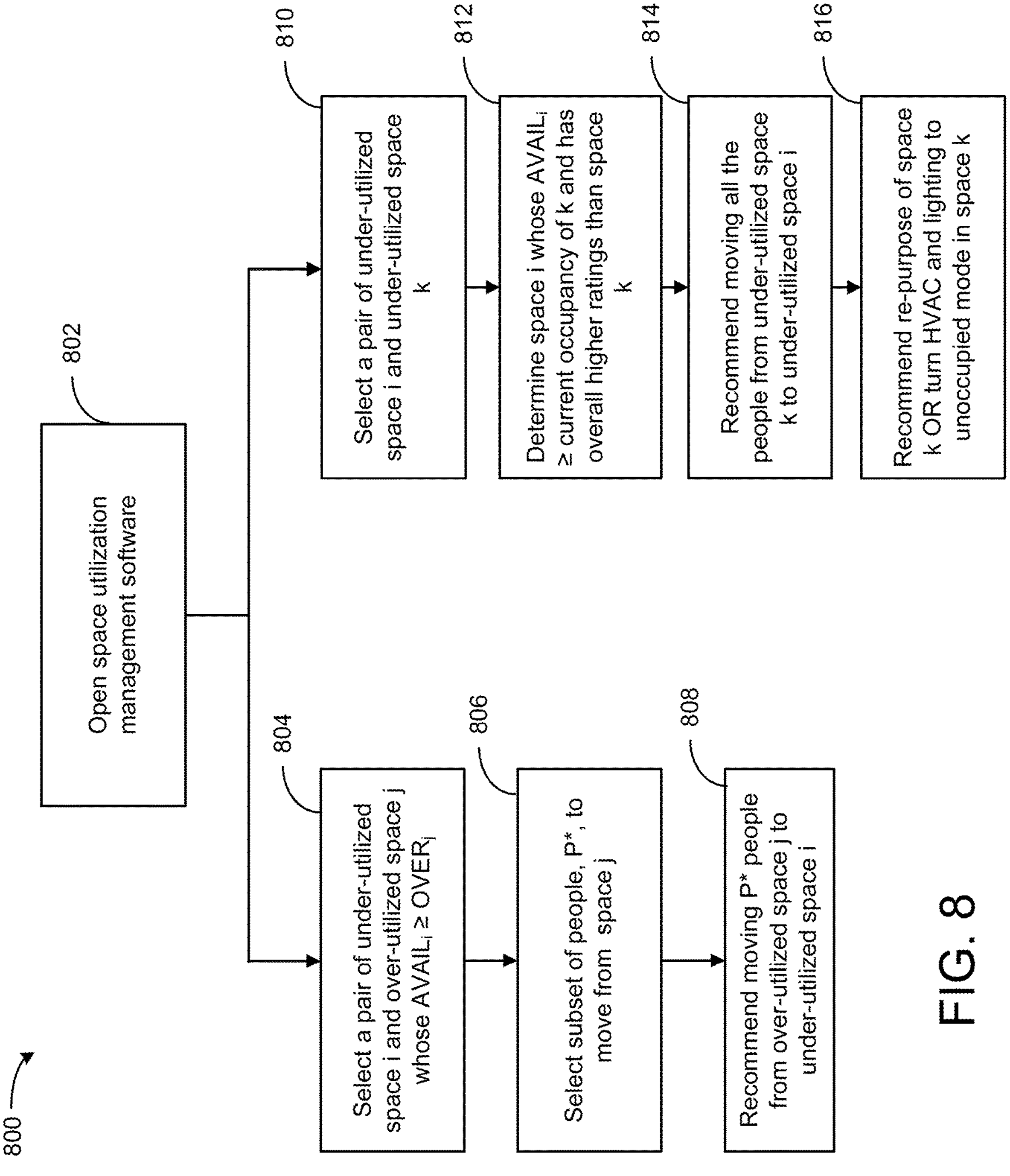
FIG. 8 is another flow diagram of a process for balancing spaces in a building, according to some embodiments.

FIG. 8 is another flow diagram of a process 800 for organizing people into different spaces, according to some embodiments. Process 800 may be performed by a data processing system (e.g., space allocation system 602). Process 800 may include any number of steps and the steps may be performed in any order. Process 800 may be similar to process 700, shown and described with respect to FIG. 7 above. At a step 802, the data processing system may open or execute open space utilization software. The open space utilization software may be software that is configured to manage the employee allocation between spaces (e.g., spaces) of a building. The open space utilization software may be stored in the data processing system or on another platform such as a cloud platform that is accessible to the data processing system. When the open space utilization software is stored on another cloud platform (which may be beneficial for cases in which the storage requirements for the software require a substantial amount of memory), the data processing system may access or communicate with the software via an application programming interface. In some embodiments, the data processing system may execute the open space utilization management software and adjust the configurations of the building equipment that operates to affect points of spaces of the building.

At a step 804, the data processing system may select an under-utilized space i and an over-utilized space j. The data processing system may select the under-utilized space i responsive to determining the under-utilized space i has a number of people assigned to the space that is below an under-utilization threshold. The data processing system may query the different spaces stored in memory and identify spaces with a number of people below an under-utilization threshold. In some embodiments, the under-utilized space threshold may be determined as a percentage (e.g., a predetermined percentage) of the maximum occupancy of the space, such as a maximum occupancy for the space based on the applicable OSHA requirements. For instance, the data processing system may determine the under-utilization of a space to be 40% of the maximum occupancy for the space before the space becomes a fire hazard. The data processing system may identify the maximum occupancy of the space from memory, multiply the maximum occupancy by 40%, and set the result to be the under-utilization threshold.

In some embodiments, the data processing system may select the over-utilized space j responsive to determining the over-utilized space j has a number of people assigned to the space that is above an over-utilization threshold. Similar to how the data processing system determines the under-utilized space i, the data processing system may determine the over-utilized space j by querying the different spaces stored in memory and identifying spaces with a number of people above an over-utilization threshold. Similar to the under-utilization threshold, the over-utilization threshold may be specific to a space, a type of the space, or a global threshold. In some embodiments, the data processing system may determine the over-utilization threshold based on the maximum occupancy of the space similar to how the data processing system may determine under-utilization thresholds.

In some embodiments, the data processing system may determine the under-utilized space i and the over-utilized space j responsive to the under-utilized space i having the highest availability and/or the over-utilized space having the highest size of over-population (e.g., the highest number of people above the space's respective over-utilization threshold). The data processing system may determine the availability of each under-utilized space and identify under-utilized space i as the space with the most availability. The data processing system may determine the over-utilization of each over-utilized space and identify over-utilized space j as the space with the highest over-utilization. Thus, in some embodiments, the data processing system may identify the spaces for which the most individuals need to be moved and corresponding spaces that have the most availability to move the individuals.

Upon selecting spaces i and j, the data processing system may select a subset of people from the over-utilized space j to move to the under-utilized space i. In some embodiments, the data processing system may select the people based on the preferences of the people for specific building characteristics (e.g., preferred values of building points such as space temperature, luminescence, and/or humidity). In some embodiments, the data processing system may additionally or instead select the people to move based on the preferences of the people for the under-utilized space i. For instance, the data processing system may compare the preferences of the people of the over-utilized space j for different points to the average or median value or the setpoint of the respective point in space i. The data processing system may determine differences between the preferences and the value for each space for the individuals and use an objective function to determine prediction scores for each individual. The objective function may be a function in which weights are applied to the differences based on the point and the weighted differences are aggregated together to determine a prediction score for each individual. In some embodiments, the objective function may involve comparing the ratings of the individuals for the under-utilized space j with a maximum rating (e.g., a highest possible rating or a highest rating of the individuals of space j space for space i). In some embodiments, the objective function may involve comparing the ratings of the individuals to an average of the ratings provided by the individuals. The objective function may weight the difference in ratings and aggregate the weighted difference to determine the prediction score for each individual. Upon determining the prediction scores for the individuals of space i, the data processing system may identify and select a number of people with the lowest prediction scores that is equal to or greater than the size of the over-population of the over-utilized space j.

At a step 808, the data processing system may recommend moving the selected subset of people from over-utilized space j to under-utilized space i. The data processing system may generate a record comprising a string or text recommending to move the selected subset of individuals to under-utilized space i. The data processing system may cause the recommendation to be displayed at a user interface to a user that can update the system to reassign the subset of people to under-utilized space i. In some embodiments, the data processing system may update the data structure that maintains the space assignments for the individuals to indicate the individuals have been reassigned to space i. The data processing system repeatedly perform this process until it determines there are not any over-utilized spaces in the building or there are not any under-utilized spaces to which the data processing system can reassign people.

In some embodiments, instead of performing the above steps 804-808, the data processing system may perform another process beginning at a step 810. In some embodiments, The data processing system may perform step 810 instead of step 802 responsive to determining there are not any over-utilized spaces in the building or there is not an under-utilized space with an availability that is equal to or greater than an the over-utilization of an over-utilized space. In either instance, the data processing system may select a pair of under-utilized spaces i and k. The data processing system may select the two under-utilized spaces from memory after determining the number of people that are assigned to each space are above a respective under-utilization threshold and/or have the highest availability.

At a step 812, the data processing system may determine whether space i has an availability that is greater than the occupancy (e.g., the total occupancy) of space k. To do so, the data processing system may determine the availability of space i as the difference between the total number of people assigned to space i and the over-utilization threshold of space i. The data processing system may determine the occupancy of space k as the total number of people that are assigned to space k. The data processing system may compare the determined availability and occupancy to determine if space i has enough availability so the data processing system can move all of the people of space k to space i. If the data processing system determines space i does not have enough availability, the data processing system may determine if space k has enough availability so the data processing system can move all of the people of space i to space k. If the data processing system determines neither space i or k have enough availability, the data processing system may identify another under-utilized space 1 from memory to repeat the process for space i or space k to determine whether to move people into or out of space 1.

If the data processing system determines space i has enough availability to move the people from space k to space i, the data processing system may determine if space i has higher ratings than space k. For example, the data processing system may determine the ratings that the people of space i rated space j and vice versa. The data processing system may aggregate the respective ratings to determine a total rating that the people of space k provided for space i and that the people of space i provided for space k. The data processing system may determine if the aggregate rating for space i is greater than the aggregate rating for space k. If the data processing system determines the aggregate rating for space i is higher, at a step 814, the data processing system may move the people from space k to space i. Otherwise, the data processing system may determine if space k has enough availability to receive the occupancy of space i. If space k has enough availability, the data processing system may move the people from space i to space k. If the data processing system determines space k cannot hold the occupancy of space i, the data processing system may return to step 810 and identify new under-utilized spaces to repeat the process. In these instances, in some embodiments, the data processing system may generate an alert indicating the people cannot be moved between spaces i and k and present the alert on a user interface.

Responsive to the data processing system determining the occupancy of space k can be moved to space i, the data processing system may recommend moving all of the people from space k to space i. The data processing system may do so by generating a record with the recommendation and presenting the recommendation on a user interface. In some embodiments, the data processing system may reassign the individuals from space k to space i by updating a data structure that contains the assignments of the people of space k to indicate they have been reassigned to space i (e.g., update values assigning the individuals to their respective spaces).

At a step 816, the data processing system may recommend re-purposing space k. For example, in some embodiments, the data processing system may generate a record containing a recommendation to re-purpose space k into a different type of space (e.g., a kitchen, a common area, a bathspace, a hallway, etc.). The data processing system may do so because space k no longer has any individuals assigned to work or inhabit the space and the space may be free to be used for other purposes.

In some embodiments, in addition or instead of recommending to re-purpose space k, the data processing system may modify operating parameters of building equipment that operates for space k (e.g., operates to maintain one or more setpoints of space k). The data processing system may identify identifications of such equipment in memory and update values or attributes of the equipment to indicate how the equipment operates based on the individuals of space k being reassigned to a different space. For example, the data processing system may adjust the equipment's operating parameters into an unoccupied mode (e.g., a low power or an off mode). The data processing system may do so because there are no longer any individuals assigned to the space to make comfortable.

Figure 9:
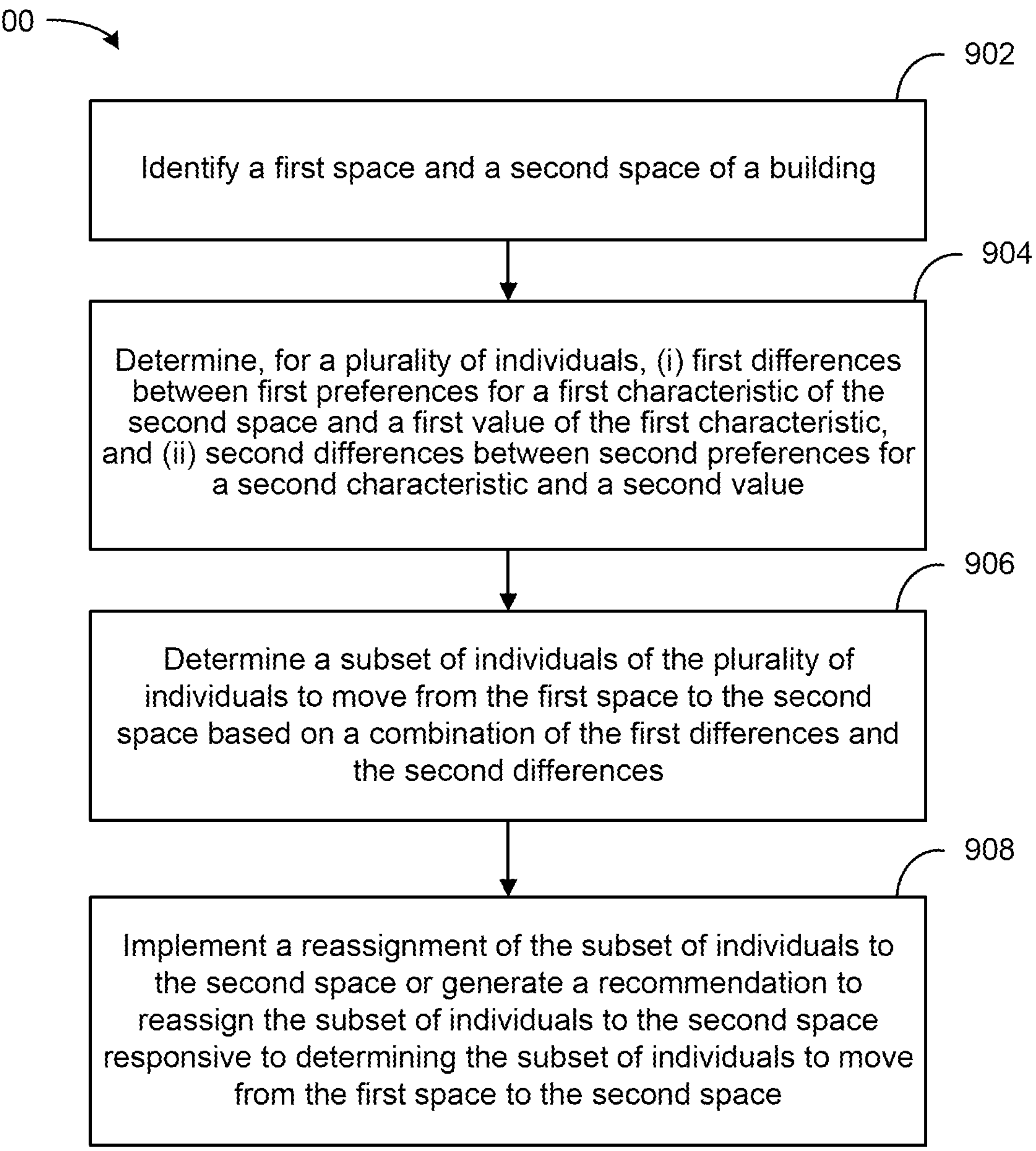
FIG. 9 is a flow diagram of a process for reassigning a subset of people from an over-utilized space to an under-utilized space, according to some embodiments.

FIG. 9 is a flow diagram of a process 900 for reassigning a subset of people from an over-utilized space into an under-utilized space, according to some embodiments. Process 900 may be performed by a data processing system (e.g., space allocation system 602). Process 900 may include any number of steps and the steps may be performed in any order. At a step 902, the data processing system may identify a first space and a second space of a building. At a step 904, the data processing system may determine, for a plurality of individuals, (i) first differences between preferences for a first characteristic of the second space and a first value (e.g., a setpoint for the first characteristic), and (ii) second differences between preferences for a second characteristics and a second value (e.g., a setpoint for the second characteristic). At a step 906, the data processing system may determine a subset of individuals of the plurality of individuals to move from the first space to the second space based on a combination of the first differences and the second differences. At a step 908, the data processing system may implement a reassignment of the subset of individuals to the second space. In some embodiments, the data processing system may additionally or instead generate a recommendation to reassign the subset of individuals to the second space responsive to determining the subset of individuals to move from the first space to the second space.

Figure 10:
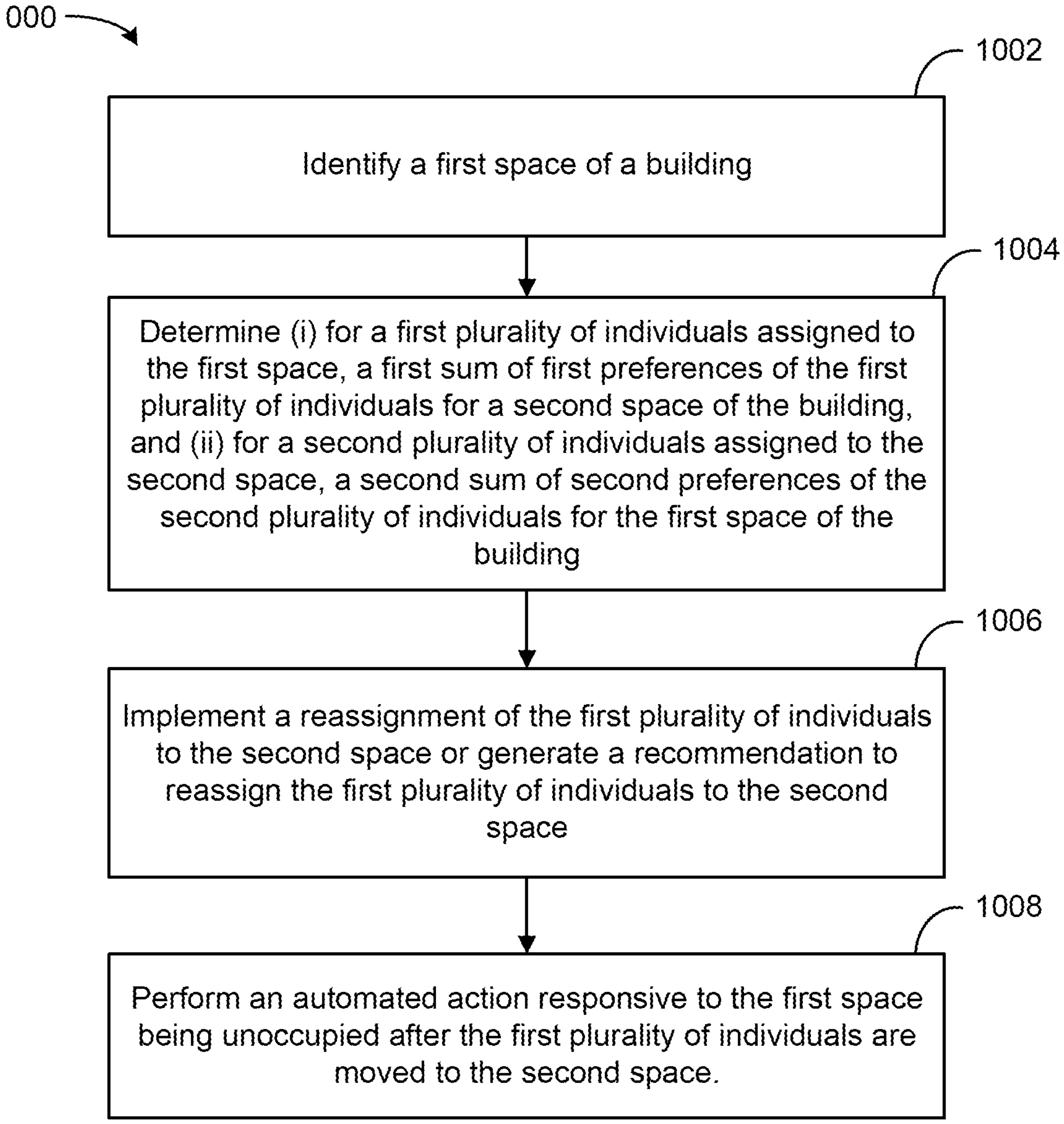
FIG. 10 is a flow diagram of a process for reassigning people from one under-utilized space to another under-utilized space, according to some embodiments.

FIG. 10 is a flow diagram of a process 1000 for reassigning people into another space based on the space preferences of the people and setpoints of the new space, according to some embodiments. Process 1000 may be performed by a data processing system (e.g., space allocation system 602). Process 1000 may include any number of steps and the steps may be performed in any order. At a step 1002, the data processing system may identify a first space of a building. At a step 1004, the data processing system may determine (i) for a first plurality of individuals assigned to the first space, a first sum of first preferences of the first plurality of individuals for a second space of the building, and (ii) for a second plurality of individuals assigned to the second space, a second sum of second preferences of the second plurality of individuals for the first space of the building. At a step 1006, the data processing system may implement a reassignment of the first plurality of individuals to the second space or generate a recommendation to reassign the first plurality of individuals to the second space. At a step 1008, the data processing system may perform an automated action responsive to the first space being unoccupied after the first plurality of individuals are moved to the second space.

Figure 11:
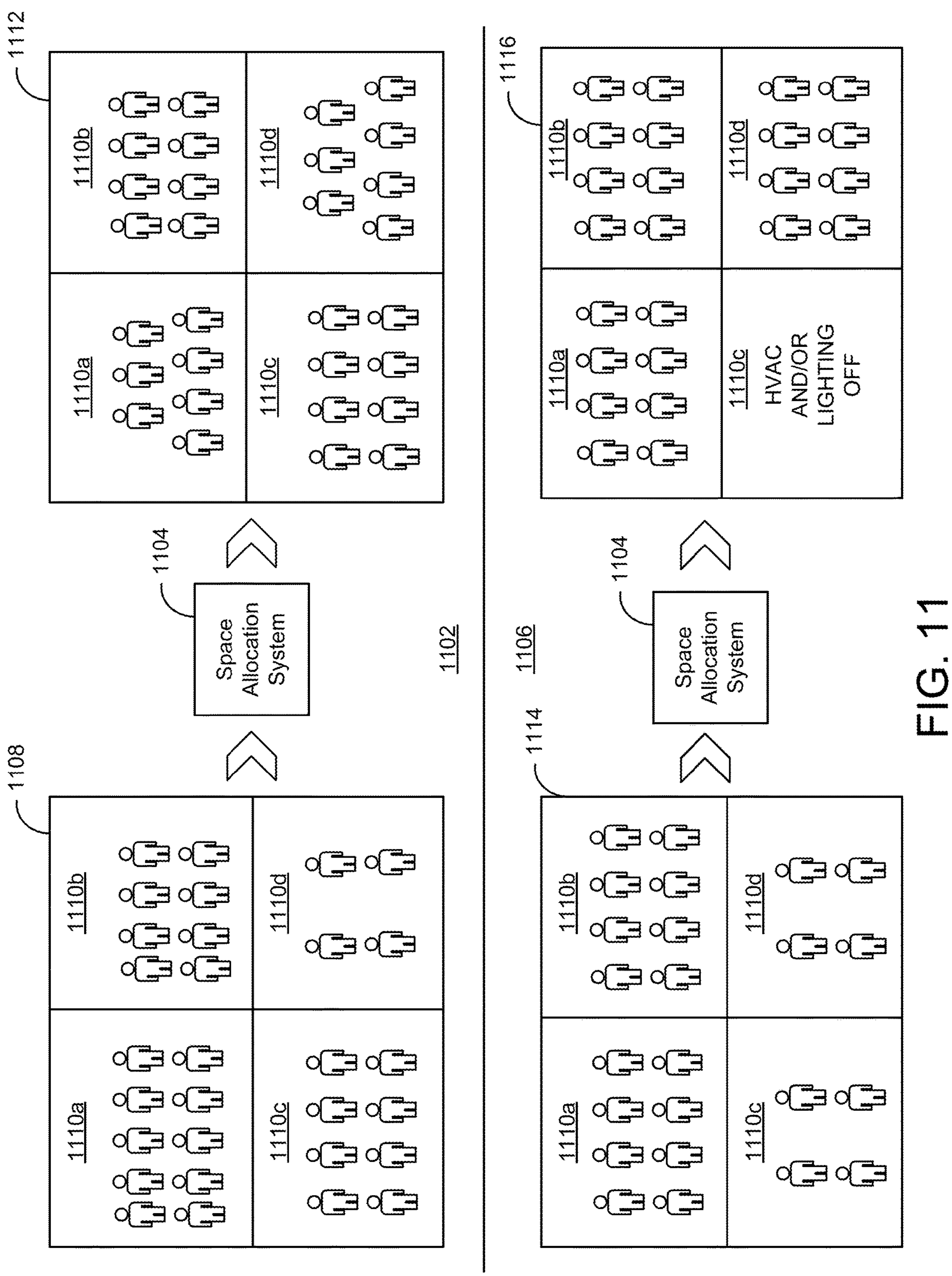
FIG. 11 is a sequence diagram illustrating two sequences of reassigning employees from one space of a building to another space of the building, according to some embodiments.

FIG. 11 is a sequence diagram illustrating two sequences 1102 and 1104 for reassigning employees from one space of a building to another space of the building, according to some embodiments. Sequence 1102 may be a sequence of a space allocation system 1104 (e.g., space allocation system 602) moving a subset of individuals that are initially assigned to a room that is over capacity to another room that is under capacity. Sequence 1102 may be a sequence of space allocation system 1104 moving individuals from one room that is under capacity to another room that is under capacity.

In sequence 1102, space allocation system 1104 may manage space assignments for individuals of a building that are assigned to rooms 1110*a-d* of the building in an arrangement 1108. Space allocation system 1104 may identify the number of individuals that are assigned to each of the rooms in arrangement 1108. Space allocation system 1104 may determine room 1110*a* is over-utilized and room 1110*d* is under-utilized after comparing their occupancy to under-utilization and/or over-utilization thresholds. Space allocation system 1104 may select individuals from room 1110*a* to move to room 1110*d* based on the individuals' preferred room characteristics and their ratings for room 1110*d*. Space allocation system 1104 may then move the selected individuals from room 1110*a* to room 1110*d*, thus causing room 1110*a* to no longer be over-utilized and/or for room 1110*d* to no longer be under-utilized in an arrangement 1112.

In sequence 1106, space allocation system 1104 may manage space assignments for individuals of a building that are assigned to rooms 1110*a-d* of the building in an arrangement 1114. Sequence 1106 may occur after or before sequence 1102. Space allocation system 1104 may identify the number of individuals that are assigned to each of the rooms in arrangement 1114. Space allocation system 1104 may determine there are not any over-utilized rooms in arrangement 1114, and thus may determine if there are any pairs of under-utilized room that can be combined. Space allocation system 1104 may identify two under-utilized rooms 1110*c* and 1110*d* and identify the ratings of the occupants for the other under-utilized room (e.g., the ratings the individuals provided for the other room). Space allocation system 1104 may determine the occupants of room 1110*c* and have a higher rating for room 1110*d* than the occupants of room 1110*d* have for room 1110*c*. Accordingly, space allocation system 1104 may move the occupants of room 1110*c* to room 1110*d* in an arrangement 1116. Space allocation system 1104 may then turn off the HVAC and/or lighting equipment of service room 1110*c* because there are no longer any occupants in room 1110*c* for which a comfortability of room 1110*c* needs to be maintained.

Configuration of Exemplary Embodiments

It should be appreciated that the systems and methods disclosed herein can be used to control any building equipment system that affects a condition of a building or space, such as, but not limited to, an HVAC system, waterside system, airside system, electrical system, or any other building equipment system. The illustrations and descriptions herein describe embodiments configured to control of an HVAC system, but these and other embodiments can be extended to control any one of the other building equipment systems.

It should also be appreciated that the systems and methods disclosed herein can utilize any machine learning control algorithm. RL and DRL models provide a framework for state-driven control using training data, but other models can be used to control the building equipment, such as, but not limited to, genetic algorithm control, neural network control, artificial intelligence, and other machine learning control.

The construction and arrangement of the systems and methods as shown in the various exemplary embodiments are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.). For example, the position of elements can be reversed or otherwise varied and the nature or number of discrete elements or positions can be altered or varied. Accordingly, all such modifications are intended to be included within the scope of the present disclosure. The order or sequence of any process or method steps can be varied or re-sequenced according to alternative embodiments. Other substitutions, modifications, changes, and omissions can be made in the design, operating conditions and arrangement of the exemplary embodiments without departing from the scope of the present disclosure.

The present disclosure contemplates methods, systems and program products on any machine-readable media for accomplishing various operations. The embodiments of the present disclosure can be implemented using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. Combinations of the above are also included within the scope of machine-readable media. Machine-executable instructions include, for example, instructions and data which cause a general purpose computer, special purpose computer, or special purpose processing machines to perform a certain function or group of functions.

Although the figures show a specific order of method steps, the order of the steps may differ from what is depicted. Also two or more steps can be performed concurrently or with partial concurrence. Such variation will depend on the software and hardware systems chosen and on designer choice. All such variations are within the scope of the disclosure. Likewise, software implementations could be accomplished with standard programming techniques with rule based logic and other logic to accomplish the various connection steps, processing steps, comparison steps and decision steps.

The term "client or "server" include all kinds of apparatus, devices, and machines for processing data, including by way of example a programmable processor, a computer, a system on a chip, or multiple ones, or combinations, of the foregoing. The apparatus may include special purpose logic circuitry, e.g., a field programmable gate array (FPGA) or an application specific integrated circuit (ASIC). The apparatus may also include, in addition to hardware, code that creates an execution environment for the computer program in question (e.g., code that constitutes processor firmware, a protocol stack, a database management system, an operating system, a cross-platform runtime environment, a virtual machine, or a combination of one or more of them). The apparatus and execution environment may realize various different computing model infrastructures, such as web services, distributed computing and grid computing infrastructures.

The systems and methods of the present disclosure may be completed by any computer program. A computer program (also known as a program, software, software application, script, or code) may be written in any form of programming language, including compiled or interpreted languages, declarative or procedural languages, and it may be deployed in any form, including as a stand-alone program or as a module, component, subroutine, object, or other unit suitable for use in a computing environment. A computer program may, but need not, correspond to a file in a file system. A program may be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program may be deployed to be executed on one computer or on multiple computers that are located at one site or distributed across multiple sites and interconnected by a communication network.

The processes and logic flows described in this specification may be performed by one or more programmable processors executing one or more computer programs to perform actions by operating on input data and generating output. The processes and logic flows may also be performed by, and apparatus may also be implemented as, special purpose logic circuitry (e.g., an FPGA or an ASIC).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing actions in accordance with instructions and one or more memory devices for storing instructions and data. Generally, a computer will also include, or be operatively coupled to receive data from or transfer data to, or both, one or more mass storage devices for storing data (e.g., magnetic, magneto-optical disks, or optical disks). However, a computer need not have such devices. Moreover, a computer may be embedded in another device (e.g., a mobile telephone, a personal digital assistant (PDA), a mobile audio or video player, a game console, a Global Positioning System (GPS) receiver, or a portable storage device (e.g., a universal serial bus (USB) flash drive), etc.). Devices suitable for storing computer program instructions and data include all forms of non-volatile memory, media and memory devices, including by way of example semiconductor memory devices (e.g., EPROM, EEPROM, and flash memory devices; magnetic disks, e.g., internal hard disks or removable disks; magneto-optical disks; and CD ROM and DVD-ROM disks). The processor and the memory may be supplemented by, or incorporated in, special purpose logic circuitry.

To provide for interaction with a user, implementations of the subject matter described in this specification may be implemented on a computer having a display device (e.g., a CRT (cathode ray tube), LCD (liquid crystal display), OLED (organic light emitting diode), TFT (thin-film transistor), or other flexible configuration, or any other monitor for displaying information to the user and a keyboard, a pointing device, e.g., a mouse, trackball, etc., or a touch screen, touch pad, etc.) by which the user may provide input to the computer. Other kinds of devices may be used to provide for interaction with a user as well; for example, feedback provided to the user may be any form of sensory feedback (e.g., visual feedback, auditory feedback, or tactile feedback), and input from the user may be received in any form, including acoustic, speech, or tactile input. In addition, a computer may interact with a user by sending documents to and receiving documents from a device that is used by the user; for example, by sending web pages to a web browser on a user's client device in response to requests received from the web browser.

Implementations of the subject matter described in this disclosure may be implemented in a computing system that includes a back-end component (e.g., as a data server), or that includes a middleware component (e.g., an application server), or that includes a front end component (e.g., a client computer) having a graphical user interface or a web browser through which a user may interact with an implementation of the subject matter described in this disclosure, or any combination of one or more such back end, middleware, or front end components. The components of the system may be interconnected by any form or medium of digital data communication (e.g., a communication network). Examples of communication networks include a LAN and a WAN, an inter-network (e.g., the Internet), and peer-to-peer networks (e.g., ad hoc peer-to-peer networks).

The present disclosure may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, descriptions thereof may not be repeated. Further, features or aspects within each example embodiment should typically be considered as available for other similar features or aspects in other example embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

What is claimed is:

1. A method for balancing space utilization between a first space that is overutilized and a second space that is underutilized in a building, comprising:

identifying, by one or more processors, the first space and the second space of the building, the first space having a first utilization rate that exceeds a second utilization rate of the second space;

determining, by the one or more processors for a plurality of individuals assigned to the first space, (i) first differences between first preferences of the plurality of individuals for a first characteristic of the second space and a first value of the first characteristic, and (ii) second differences between second preferences of the plurality of individuals for a second characteristic of the second space and a second value of the second characteristic, wherein the first characteristic and the second characteristic are space environment characteristics and different from occupancy and utilization, and wherein the first characteristic is a different type of space environment characteristic than a type of space environment characteristic of the second characteristic;

obtaining, by the one or more processors, first weights for the plurality of individuals corresponding to the first characteristic and second weights for the plurality of individuals corresponding to the second characteristic;

determining, by the one or more processors, a subset of individuals of the plurality of individuals to move from the first space to the second space based on individual-space prediction scores, which are calculated based on the first weights, the first differences, the second weights, and the second differences for the plurality of individuals;

implementing, by the one or more processors, a reassignment of the subset of individuals to the second space or generating, by the one or more processors, a recommendation to reassign the subset of individuals to the second space responsive to determining the subset of individuals to move from the first space to the second space; and performing, by the one or more processors, an automated action comprising adjusting operation of building equipment in at least one of the first space or the second space after the reassignment or after generating the recommendation, the automated action causing improved energy efficiency of the building equipment in at least one of the first space or the second space.

2. The method of claim 1, further comprising:

adjusting, by the one or more processors, configurations of building equipment that operate to affect one or more points of the first space or the second space based on the determined subset of individuals.

3. The method of claim 1, wherein implementing the reassignment of the subset of individuals to the second space comprises updating, by the one or more processors, a data structure stored in memory to indicate the subset of individuals are assigned to the second space.

4. The method of claim 1, wherein determining the subset of individuals to move from the first space to the second space comprises determining, by the one or more processors, the subset of individuals using an objective function.

5. The method of claim 4, wherein determining the subset of individuals comprises:

determining, by the one or more processors, the individual-space prediction scores for the plurality of individuals assigned to the first space according to preferences of the plurality of individuals; and identifying, by the one or more processors, the subset of individuals of the plurality of individuals responsive to the subset of individuals having lower individual-space prediction scores than other individuals of the first space.

6. The method of claim 1, further comprising:

receiving, by the one or more processors, a plurality of space ratings for the second space from the plurality of individuals; and determining, by the one or more processors, third differences between the plurality of space ratings and a space rating value;

wherein determining the subset of individuals to move from the first space to the second space further comprises aggregating, by the one or more processors, the third differences with the first differences and the second differences.

7. The method of claim 1, wherein identifying the first space and the second space of the building comprises:

generating, by the one or more processors, (i) a first list of spaces with first space utilization rates above first thresholds that correspond to the respective spaces of the first list, and (ii) a second list of spaces with second space utilization rates below second thresholds that correspond to the respective spaces of the second list; and identifying, by the one or more processors, (i) the first space from the first list based on a first difference between the first space utilization rate of the first space and a first threshold of the first space, and (ii) the second space from the second list based on a second difference between the second utilization rate of the second space and a second threshold of the second space.

8. The method of claim 7, wherein identifying the second space from the second list comprises:

comparing, by the one or more processors, the second difference with the first difference; and identifying, by the one or more processors, the second space responsive to the second difference exceeding the first difference.

9. A system for balancing space utilization between a first space that is overutilized and a second space that is underutilized in a building, the system comprising one or more memory devices configured to store instructions thereon that, when executed by one or more processors, cause the one or more processors to:

identify the first space and the second space of the building, the first space having a first utilization rate that exceeds a second utilization rate of the second space;

determine, for a plurality of individuals assigned to the first space, (i) first differences between first preferences of the plurality of individuals for a first characteristic of the second space and a first value of the first characteristic, and (ii) second differences between second preferences of the plurality of individuals for a second characteristic of the second space and a second value of the second characteristic, wherein the first characteristic and the second characteristic are space environment characteristics and different from occupancy and utilization, and wherein the first characteristic is a different type of space environment characteristic than a type of space environment characteristic of the second characteristic;

obtain first weights for the plurality of individuals corresponding to the first characteristic and second weights for the plurality of individuals corresponding to the second characteristic;

determine a subset of individuals of the plurality of individuals to move from the first space to the second space based on individual-space prediction scores, which are calculated based on the first weights, the first differences, the second weights, and the second differences for the plurality of individuals;

implement a reassignment of the subset of individuals to the second space or generate a recommendation to reassign the subset of individuals to the second space responsive to determining the subset of individuals to move from the first space to the second space; and perform an automated action comprising adjusting operation of building equipment in at least one of the first space or the second space after the reassignment or after generating the recommendation, the automated action causing improved energy efficiency of the building equipment in at least one of the first space or the second space.

10. The system of claim 9, wherein the instructions cause the one or more processors to:

adjust configurations of building equipment that operate to affect one or more points of the first space or the second space based on the determined subset of individuals.

11. The system of claim 9, wherein the instructions cause the one or more processors to implement the reassignment of the subset of individuals to the second space by updating a data structure stored in memory to indicate the subset of individuals are assigned to the second space.

12. The system of claim 9, wherein the instructions cause the one or more processors to determine the subset of individuals to move from the first space to the second space by determining the subset of individuals using an objective function.

13. The system of claim 11, wherein the instructions cause the one or more processors to determine the subset of individuals by:

iteratively determining the individual-space prediction scores for the plurality of individuals assigned to the first space according to preferences of the plurality of individuals; and identifying the subset of individuals of the plurality of individuals responsive to the subset of individuals having lower individual-space prediction scores than others of the first space.

14. A method of addressing underutilization of spaces in a building, comprising:

identifying, by one or more processors, a first space of the building and a second space of the building;

determining, by the one or more processors for a first plurality of individuals assigned to the first space and for a second plurality of individuals assigned to the second space of the building, (i) first differences between first preferences of the first plurality of individuals and the second plurality of individuals for a first characteristic of the second space and a first value of the first characteristic, and (ii) second differences between second preferences of the first plurality of individuals and the second plurality of individuals for a second characteristic of the second space and a second value of the second characteristic, wherein the first characteristic and the second characteristic are space environment characteristics and different from occupancy and utilization, and wherein the first characteristic is a different type of space environment characteristic than a type of space environment characteristic of the second characteristic;

obtaining, by the one or more processors first weights for the first plurality of individuals and the second plurality of individuals corresponding to the first characteristic and second weights for the first plurality of individuals and the second plurality of individuals corresponding to the second characteristic;

determining, by the one or more processors, (i) for the first plurality of individuals assigned to the first space, a first rating of the first plurality of individuals for the second space of the building, and (ii) for the second plurality of individuals assigned to the second space, a second rating of the second plurality of individuals for the first space of the building based on individual-space prediction scores, which are calculated based on the first weights, the first differences, the second weights, and the second differences for the first plurality of individuals and the second plurality of individuals;

responsive to determining the first rating exceeds the second rating, implementing, by the one or more processors, a reassignment of the first plurality of individuals to the second space or generating, by the one or more processors, a recommendation to reassign the first plurality of individuals to the second space; and performing, by the one or more processors, an automated action responsive to the first space being unoccupied after the first plurality of individuals are moved to the second space, the automated action comprising adjusting operation of building equipment in the first space.

15. The method of claim 14, wherein performing the automated action comprises modifying, by the one or more processors, parameters of the building equipment to reduce energy usage in the unoccupied first space.

16. The method of claim 15, wherein modifying parameters of the building equipment comprises adjusting, by the one or more processors, configurations of heating, ventilation, or air conditioning equipment or light equipment to an unoccupied mode.

17. The method of claim 14, wherein implementing the reassignment of the first plurality of individuals to the second space comprises updating, by the one or more processors, a data structure stored in memory to indicate the first plurality of individuals are assigned to the second space.

18. The method of claim 17, further comprising:

determining, by the one or more processors, an availability of the second space by comparing a utilization of the second space with a capacity of the second space, wherein implementing the reassignment of the first plurality of individuals or generating the recommendation to reassign the first plurality of individuals is performed further responsive to determining, by the one or more processors, the first plurality of individuals does not exceed the availability of the second space.

* * * * *